(12) United States Patent
Burrows et al.

(10) Patent No.: US 10,060,180 B2
(45) Date of Patent: Aug. 28, 2018

(54) FLASH-TREATED INDIUM TIN OXIDE COATINGS, PRODUCTION METHODS, AND INSULATING GLASS UNIT TRANSPARENT CONDUCTIVE COATING TECHNOLOGY

(71) Applicant: Cardinal CG Company, Eden Prairie, MN (US)

(72) Inventors: Keith James Burrows, Mineral Point, WI (US); Kari B. Myli, Sauk City, WI (US)

(73) Assignee: Cardinal CG Company, Eden Prairie, MN (US)

( * ) Notice: Subject to any disclaimer, the term of this patent is extended or adjusted under 35 U.S.C. 154(b) by 46 days.

(21) Appl. No.: 14/934,706

(22) Filed: Nov. 6, 2015

(65) Prior Publication Data

US 2016/0060163 A1 Mar. 3, 2016

Related U.S. Application Data

(63) Continuation-in-part of application No. 14/185,287, filed on Feb. 20, 2014, now Pat. No. 9,453,365, which
(Continued)

(51) Int. Cl.
*C03C 17/34* (2006.01)
*E06B 3/677* (2006.01)
(Continued)

(52) U.S. Cl.
CPC ........ *E06B 3/677* (2013.01); *B32B 17/10055* (2013.01); *B32B 17/10467* (2013.01);
(Continued)

(58) Field of Classification Search
CPC ........ C23C 14/086; C23C 14/34; C23C 14/58; C03C 2217/948; C03C 2217/231
See application file for complete search history.

(56) References Cited

U.S. PATENT DOCUMENTS 3,192,575 A 7/1965 Rosenau, Jr. et al.
3,293,344 A 12/1966 Barnes et al.
(Continued)

FOREIGN PATENT DOCUMENTS

EP 1765740 A1 3/2007
GB 718189 A 11/1954
(Continued)

OTHER PUBLICATIONS

Anwand et al., "Implantation-caused open volume defects in Ge after flash lamp annealing (FLA) probed by slow positron implantation spectroscopy (SPIS)," Applied Surface Science, vol. 255, 2008, pp. 81-83.
(Continued)

*Primary Examiner* — Donald J Loney
(74) *Attorney, Agent, or Firm* — Fredrikson & Byron, P.A.

(57) ABSTRACT

The invention provides flash-treated transparent conductive coatings based on indium tin oxide. Some embodiments provide a method that involves depositing a substoichiometric indium tin oxide film on a glass pane, and thereafter flash treating the substoichiometric indium tin oxide film to produce a flash-treated indium tin oxide film. Other embodiments provide a multiple-pane insulating glass unit having a flash-treated indium tin oxide film on an internal surface.

28 Claims, 10 Drawing Sheets

Related U.S. Application Data is a continuation of application No. 13/006,992, filed on Jan. 14, 2011, now Pat. No. 8,658,262.

(60) Provisional application No. 61/295,694, filed on Jan. 16, 2010.

(51) Int. Cl.
*C23C 14/08* (2006.01)
*C23C 14/34* (2006.01)
*C23C 14/58* (2006.01)
*E06B 3/66* (2006.01)
*E06B 3/67* (2006.01)
*B32B 17/10* (2006.01)

(52) U.S. Cl.
CPC ........ *C03C 17/3411* (2013.01); *C23C 14/086* (2013.01); *C23C 14/34* (2013.01); *C23C 14/58* (2013.01); *E06B 3/6612* (2013.01); *E06B 3/6722* (2013.01); *C03C 2217/231* (2013.01); *C03C 2217/94* (2013.01); *C03C 2217/948* (2013.01); *C03C 2218/154* (2013.01); *Y02A 30/25* (2018.01); *Y02B 80/24* (2013.01)

(56) References Cited

U.S. PATENT DOCUMENTS

| | | |
|---|---|---|
| 3,601,375 A | 8/1971 | Bowman |
| 3,655,545 A | 4/1972 | Gillery et al. |
| 4,047,351 A | 9/1977 | Derner et al. |
| 4,065,600 A | 12/1977 | King et al. |
| 4,144,684 A | 3/1979 | Kirkbride et al. |
| 4,399,015 A | 8/1983 | Endo et al. |
| 4,407,709 A | 10/1983 | Enjouji et al. |
| 4,490,227 A | 12/1984 | Bitter et al. |
| 4,568,578 A | 2/1986 | Arfsten et al. |
| 4,654,509 A | 3/1987 | Robinson et al. |
| RE32,497 E | 9/1987 | Canfield |
| 4,698,486 A | 10/1987 | Sheets et al. |
| 4,789,771 A | 12/1988 | Robinson et al. |
| 4,806,220 A | 2/1989 | Finley |
| 4,941,302 A | 7/1990 | Barry |
| 4,965,225 A | 10/1990 | Yamagishi et al. |
| 5,011,585 A | 4/1991 | Brochot et al. |
| 5,059,295 A | 10/1991 | Finley |
| H975 H | 11/1991 | Selkowitz et al. |
| 5,122,180 A | 6/1992 | Mathivat et al. |
| 5,135,581 A | 8/1992 | Tran et al. |
| 5,201,926 A | 4/1993 | Szczyrbowski et al. |
| 5,225,273 A | 7/1993 | Mikoshiba et al. |
| 5,242,560 A | 9/1993 | Lingle et al. |
| 5,279,722 A | 1/1994 | Szczyrbowski et al. |
| 5,352,504 A | 10/1994 | Boulanger et al. |
| 5,376,455 A | 12/1994 | Hartig et al. |
| 5,387,433 A | 2/1995 | Balian et al. |
| 5,425,861 A | 6/1995 | Hartig et al. |
| 5,543,229 A | 8/1996 | Ohsaki et al. |
| 5,552,180 A | 9/1996 | Finley et al. |
| 5,584,902 A | 12/1996 | Hartig et al. |
| 5,630,918 A | 5/1997 | Takahara et al. |
| 5,657,149 A | 8/1997 | Buffat et al. |
| 5,663,829 A | 9/1997 | Lefrou et al. |
| 5,677,240 A | 10/1997 | Murakami et al. |
| 5,709,930 A | 1/1998 | DePauw |
| 5,770,321 A | 6/1998 | Hartig et al. |
| 5,793,518 A | 8/1998 | Lefrou et al. |
| 5,827,409 A | 10/1998 | Iwata et al. |
| 5,830,252 A | 11/1998 | Finley et al. |
| 5,873,203 A | 2/1999 | Thiel et al. |
| 5,889,608 A | 3/1999 | Buffat et al. |
| 6,021,152 A | 2/2000 | Olsen et al. |
| 6,024,084 A | 2/2000 | Gerhardinger |
| 6,045,896 A | 4/2000 | Boire et al. |
| 6,114,043 A | 9/2000 | Joret et al. |
| 6,117,560 A | 9/2000 | Maloney et al. |
| 6,121,178 A | 9/2000 | Eshima et al. |
| 6,148,563 A | 11/2000 | Roche et al. |
| 6,159,607 A | 12/2000 | Hartig et al. |
| 6,177,200 B1 | 1/2001 | Maloney |
| 6,180,247 B1 | 1/2001 | Szczyrbowski et al. |
| 6,300,594 B1 | 10/2001 | Kinoshita et al. |
| 6,315,874 B1 | 11/2001 | Suzuki et al. |
| 6,318,027 B1 | 11/2001 | Richardson et al. |
| 6,319,556 B1 | 11/2001 | Olsen et al. |
| 6,329,044 B1 | 12/2001 | Inoue et al. |
| 6,337,467 B1 | 1/2002 | Sik |
| 6,340,529 B1 | 1/2002 | Ebisawa et al. |
| 6,379,508 B1 | 4/2002 | Kobayashi et al. |
| 6,383,345 B1 | 5/2002 | Kim et al. |
| 6,416,890 B1 | 7/2002 | Terneu et al. |
| 6,425,990 B1 | 7/2002 | Ishibashi |
| 6,454,886 B1 | 9/2002 | Martin et al. |
| 6,468,403 B1 | 10/2002 | Shimizu et al. |
| 6,472,072 B1 | 10/2002 | Ebisawa et al. |
| 6,472,632 B1 | 10/2002 | Peterson et al. |
| 6,475,354 B1 | 11/2002 | Toyama |
| 6,495,251 B1 | 12/2002 | Arbab et al. |
| 6,548,190 B2 | 4/2003 | Spitsberg et al. |
| 6,551,715 B1 | 4/2003 | Seto et al. |
| 6,562,490 B2 | 5/2003 | Ebisawa et al. |
| 6,580,051 B2 | 6/2003 | Peterson et al. |
| 6,600,127 B1 | 7/2003 | Peterson et al. |
| 6,610,410 B2 | 8/2003 | Ebisawa et al. |
| 6,617,056 B1 | 9/2003 | Hara et al. |
| 6,623,846 B2 | 9/2003 | Laird |
| 6,632,491 B1 | 10/2003 | Thomsen et al. |
| 6,653,591 B1 | 11/2003 | Peterson et al. |
| 6,656,523 B2 | 12/2003 | Russo et al. |
| 6,677,063 B2 | 1/2004 | Finley |
| 6,699,585 B2 | 3/2004 | Ebisawa et al. |
| 6,733,889 B2 | 5/2004 | Varanasi et al. |
| 6,736,806 B2 | 5/2004 | Ruiz et al. |
| 6,740,416 B1 | 5/2004 | Yokogawa et al. |
| 6,743,488 B2 | 6/2004 | Memarian et al. |
| 6,764,779 B1 | 7/2004 | Liu et al. |
| 6,767,081 B2 | 7/2004 | Shirakawa et al. |
| 6,777,639 B2 | 8/2004 | Schroder et al. |
| 6,783,861 B2 | 8/2004 | Ebisawa et al. |
| 6,793,980 B2 | 9/2004 | Ohtsu et al. |
| 6,849,165 B2 | 2/2005 | Klppel et al. |
| 6,916,389 B2 | 7/2005 | Pesiri et al. |
| 6,924,037 B1 | 8/2005 | Joret et al. |
| 6,942,923 B2 | 9/2005 | Stachowiak |
| 6,955,833 B1 | 10/2005 | Gallego |
| 6,955,925 B1 | 10/2005 | Donohue et al. |
| 6,965,629 B2 | 11/2005 | Schroder et al. |
| 7,012,214 B2 | 3/2006 | Schroder et al. |
| 7,041,588 B2 | 5/2006 | Bender |
| 7,081,302 B2 | 7/2006 | Lemmer et al. |
| 7,083,857 B2 | 8/2006 | Sawada et al. |
| 7,102,141 B2 | 9/2006 | Hwang et al. |
| 7,115,837 B2 | 10/2006 | Timans et al. |
| 7,126,081 B2 | 10/2006 | Schroder et al. |
| 7,153,579 B2 | 12/2006 | Kriltz et al. |
| 7,183,229 B2 | 2/2007 | Yamanaka |
| 7,189,624 B2 | 3/2007 | Ito |
| 7,220,936 B2 | 5/2007 | Ott et al. |
| 7,258,757 B2 | 8/2007 | Huang et al. |
| 7,265,807 B2 | 9/2007 | Lifka et al. |
| 7,276,457 B2 | 10/2007 | Yoo |
| 7,279,405 B2 | 10/2007 | Itani et al. |
| 7,291,816 B2 | 11/2007 | Chen |
| 7,294,404 B2 | 11/2007 | Krisko et al. |
| 7,300,832 B2 | 11/2007 | Ito et al. |
| 7,335,421 B2 | 2/2008 | Thiel et al. |
| 7,339,728 B2 | 3/2008 | Hartig |
| 7,342,716 B2 | 3/2008 | Hartig |
| 7,598,162 B2 | 4/2009 | Yamamoto et al. |
| 7,527,868 B2 | 5/2009 | Grimal et al. |
| 7,534,496 B2 | 5/2009 | Lemmer et al. |
| 7,550,067 B2 | 6/2009 | Veerasamy |
| 7,563,514 B2 | 7/2009 | Nakayama et al. |
| 7,566,481 B2 | 7/2009 | Veerasamy |

(56) References Cited

U.S. PATENT DOCUMENTS

| | | |
|---|---|---|
| 7,572,509 B2 | 8/2009 | Hartig |
| 7,572,510 B2 | 8/2009 | Hartig |
| 7,572,511 B2 | 8/2009 | Hartig |
| 7,582,356 B2 | 9/2009 | Brochot et al. |
| 7,597,962 B2 | 10/2009 | Butz et al. |
| 7,597,964 B2 | 10/2009 | Krasnov |
| 7,604,865 B2 | 10/2009 | Krisko et al. |
| 7,641,818 B2 | 1/2010 | Nakayama et al. |
| 7,709,361 B2 | 5/2010 | Suguro |
| 7,713,632 B2 | 5/2010 | Krisko et al. |
| 7,718,707 B2 | 5/2010 | Kelman et al. |
| 7,737,385 B2 | 6/2010 | Timans et al. |
| 7,744,955 B2 | 6/2010 | Blacker et al. |
| 7,820,097 B2 | 10/2010 | Schroder et al. |
| 7,820,296 B2 | 10/2010 | Myli et al. |
| 7,820,309 B2 | 10/2010 | Myli et al. |
| 7,862,910 B2 | 1/2011 | Krisko et al. |
| 7,964,788 B2 | 6/2011 | den Boer et al. |
| 8,067,276 B2 | 11/2011 | Lee et al. |
| 8,080,141 B2 | 12/2011 | Krasnov |
| 8,211,785 B2 | 7/2012 | Itani et al. |
| 8,298,380 B2 | 10/2012 | Krasnov |
| 8,304,045 B2 | 11/2012 | Lemmer et al. |
| 8,313,620 B2 | 11/2012 | Krasnov |
| 8,318,572 B1 | 11/2012 | Shanker et al. |
| 8,355,194 B2 | 1/2013 | Granqvist |
| 8,410,712 B2 | 4/2013 | Schroder et al. |
| 8,415,657 B2 | 4/2013 | Rui et al. |
| 8,420,162 B2 | 4/2013 | Blacker et al. |
| 8,445,373 B2 | 5/2013 | Broadway et al. |
| 8,500,965 B2 | 8/2013 | Thiel |
| 8,518,221 B2 | 8/2013 | Krasnov |
| 8,524,337 B2 | 9/2013 | Lemmer et al. |
| 8,557,642 B2 | 10/2013 | Schroder et al. |
| 8,580,355 B2 | 11/2013 | Durandeau et al. |
| 8,658,262 B2 | 2/2014 | Myli et al. |
| 8,674,618 B2 | 3/2014 | Shroder et al. |
| 8,815,059 B2 | 8/2014 | McLean et al. |
| 8,834,976 B2 | 9/2014 | Lemmer et al. |
| 8,871,349 B2 | 10/2014 | Lemmer et al. |
| 8,907,258 B2 | 12/2014 | Schroder et al. |
| 8,939,606 B2 | 1/2015 | Maikowski et al. |
| 8,945,686 B2 | 2/2015 | Pope et al. |
| 9,006,047 B2 | 4/2015 | Schroder et al. |
| 9,011,649 B2 | 4/2015 | Kharchenko et al. |
| 9,052,456 B2 | 6/2015 | Hassan et al. |
| 9,073,781 B2 | 7/2015 | Nadaud et al. |
| 9,095,871 B2 | 8/2015 | Vogt et al. |
| 9,095,874 B2 | 8/2015 | Schroder et al. |
| 9,199,875 B2 | 12/2015 | Lemmer et al. |
| 9,237,637 B2 | 1/2016 | Rawson |
| 9,266,773 B2 | 2/2016 | Lemmer et al. |
| 9,494,068 B2 | 11/2016 | Schroder et al. |
| 9,580,807 B2 | 2/2017 | Bilaine et al. |
| 9,599,397 B2 | 3/2017 | Jackson |
| 9,631,283 B2 | 4/2017 | Schroder et al. |
| 9,633,876 B2 | 4/2017 | Timans et al. |
| 9,643,208 B2 | 5/2017 | Schroder et al. |
| 2001/0008710 A1 | 7/2001 | Takatsuji et al. |
| 2001/0016253 A1 | 8/2001 | Goda et al. |
| 2001/0044032 A1 | 11/2001 | Finley et al. |
| 2002/0004318 A1 | 1/2002 | Powell |
| 2002/0009601 A1 | 1/2002 | Stachowiak |
| 2002/0021495 A1 | 2/2002 | Lingle |
| 2002/0046993 A1 | 4/2002 | Peterson et al. |
| 2002/0071903 A1 | 6/2002 | Lee et al. |
| 2003/0003304 A1 | 1/2003 | Ohtsu et al. |
| 2003/0134122 A1 | 7/2003 | Wickboldt et al. |
| 2004/0004684 A1 | 1/2004 | Yang et al. |
| 2004/0137235 A1 | 7/2004 | Paul et al. |
| 2004/0147139 A1 | 7/2004 | Jiang |
| 2005/0000794 A1 | 1/2005 | Demaray et al. |
| 2005/0133085 A1 | 6/2005 | Shimada |
| 2005/0238886 A1 | 10/2005 | Gallego |
| 2006/0011466 A1 | 1/2006 | Chen |
| 2006/0118408 A1 | 6/2006 | Myli et al. |
| 2006/0121315 A1 | 6/2006 | Myli et al. |
| 2006/0144695 A1 | 7/2006 | Lee et al. |
| 2006/0201203 A1 | 9/2006 | Labrousse et al. |
| 2006/0234064 A1 | 10/2006 | Baubet et al. |
| 2007/0029186 A1 | 2/2007 | Krasnov et al. |
| 2007/0029187 A1 | 2/2007 | Krasnov |
| 2007/0081227 A1 | 4/2007 | Hartig |
| 2007/0082124 A1 | 4/2007 | Hartig |
| 2007/0082169 A1 | 4/2007 | Hartig |
| 2007/0082186 A1 | 4/2007 | Hartig |
| 2007/0087492 A1 | 4/2007 | Yamanaka |
| 2007/0137999 A1 | 6/2007 | Delrue et al. |
| 2007/0138567 A1 | 6/2007 | Ito |
| 2007/0235662 A1 | 10/2007 | Tien et al. |
| 2007/0240977 A1 | 10/2007 | Krempel-Hesse et al. |
| 2007/0241364 A1 | 10/2007 | Akao et al. |
| 2007/0272664 A1 | 11/2007 | Schroder et al. |
| 2008/0006521 A1 | 1/2008 | Schroder et al. |
| 2008/0008829 A1 | 1/2008 | Blacker et al. |
| 2008/0099066 A1 | 5/2008 | Ito et al. |
| 2008/0115471 A1 | 5/2008 | Labrousse et al. |
| 2008/0261035 A1 | 10/2008 | Grimal et al. |
| 2008/0292872 A1 | 11/2008 | Boire et al. |
| 2009/0020414 A1 | 1/2009 | Tsao et al. |
| 2009/0047509 A1 | 2/2009 | Gagliardi et al. |
| 2009/0053878 A1 | 2/2009 | Kelman et al. |
| 2009/0075069 A1 | 3/2009 | Myli et al. |
| 2009/0169846 A1 | 7/2009 | Siddle et al. |
| 2009/0180766 A1 | 7/2009 | Kusuda |
| 2009/0214880 A1 | 8/2009 | Lemmer |
| 2009/0229856 A1 | 9/2009 | Fredenberg et al. |
| 2009/0297886 A1 | 12/2009 | Gessert et al. |
| 2009/0320824 A1 | 12/2009 | Henn et al. |
| 2010/0035030 A1 | 2/2010 | Huang et al. |
| 2010/0071810 A1 | 3/2010 | Nadaud et al. |
| 2010/0098874 A1 | 4/2010 | Schroder |
| 2010/0118407 A1 | 5/2010 | Huff |
| 2011/0023959 A1 | 2/2011 | Yoo et al. |
| 2011/0094577 A1 | 4/2011 | Chatterjee et al. |
| 2011/0108108 A1 | 5/2011 | Im et al. |
| 2011/0146785 A1 | 6/2011 | Buller et al. |
| 2011/0171365 A1 | 7/2011 | Kuroda |
| 2011/0210656 A1 | 9/2011 | Lemmer et al. |
| 2011/0212279 A1 | 9/2011 | Lemmer et al. |
| 2011/0212311 A1 | 9/2011 | Lemmer et al. |
| 2011/0247851 A1 | 10/2011 | Jackson et al. |
| 2011/0262657 A1 | 10/2011 | Pope et al. |
| 2011/0312120 A1 | 12/2011 | Weiner et al. |
| 2012/0021149 A1 | 1/2012 | Myli et al. |
| 2012/0048722 A1 | 3/2012 | McLean et al. |
| 2012/0073640 A1 | 3/2012 | Daniel et al. |
| 2012/0087005 A1 | 4/2012 | Reymond et al. |
| 2012/0094075 A1 | 4/2012 | Peter et al. |
| 2012/0097222 A1 | 4/2012 | Gessert et al. |
| 2012/0100665 A1 | 4/2012 | Li et al. |
| 2012/0164420 A1 | 6/2012 | Lemmer et al. |
| 2012/0227798 A1 | 9/2012 | Pan et al. |
| 2012/0252207 A1 | 10/2012 | Lei et al. |
| 2012/0255192 A1 | 10/2012 | Schroder et al. |
| 2012/0260851 A1 | 10/2012 | Yoo et al. |
| 2013/0037913 A1 | 2/2013 | Chen et al. |
| 2013/0095292 A1 | 4/2013 | Pfaff et al. |
| 2013/0112258 A1 | 5/2013 | Park et al. |
| 2013/0118565 A1 | 5/2013 | Abou-Kandil et al. |
| 2013/0153015 A1 | 6/2013 | Lee et al. |
| 2013/0199608 A1 | 8/2013 | Emeraud |
| 2013/0267060 A1 | 10/2013 | Dauson et al. |
| 2013/0320241 A1 | 12/2013 | Krasnov et al. |
| 2014/0017857 A1 | 1/2014 | Schroder et al. |
| 2014/0154427 A1 | 6/2014 | Edd et al. |
| 2014/0154434 A1 | 6/2014 | Nunez-Regueiro et al. |
| 2014/0272465 A1 | 9/2014 | Lienhart et al. |
| 2014/0314972 A1 | 10/2014 | Myli et al. |
| 2014/0334805 A1 | 11/2014 | McLean et al. |
| 2015/0055943 A1 | 2/2015 | Schroder et al. |
| 2015/0072084 A1 | 3/2015 | Mimoun et al. |
| 2015/0124447 A1 | 5/2015 | Maikowski et al. |
| 2015/0146286 A1 | 5/2015 | Hagen et al. |

(56) References Cited

U.S. PATENT DOCUMENTS

| | | | |
|---|---|---|---|
| 2015/0176133 | A1 | 6/2015 | Pope et al. |
| 2015/0311092 | A1 | 10/2015 | Schroder et al. |
| 2016/0229741 | A1 | 8/2016 | Canova et al. |

FOREIGN PATENT DOCUMENTS

| | | | |
|---|---|---|---|
| GB | 1498142 | A | 1/1978 |
| WO | 9217412 | A1 | 10/1992 |
| WO | 03093185 | A1 | 11/2003 |
| WO | 2006110217 | A2 | 10/2006 |
| WO | 2009036284 | A1 | 3/2009 |
| WO | 2010115558 | A1 | 10/2010 |
| WO | 2011039488 | A1 | 4/2011 |
| WO | 2011105991 | A1 | 9/2011 |
| WO | 2012078395 | A2 | 6/2012 |
| WO | 2015055944 | A1 | 4/2015 |
| WO | 2015197969 | A1 | 12/2015 |

OTHER PUBLICATIONS

Endo et al., "Thin-film polycrystalline silicon solar cells formed by flash lamp annealing of a-Si films," Thin Solid Films, vol. 518, 2010, pp. 5003-5006.

Gebel et al., "Flash lamp annealing with millisecond pulses for ultra-shallow boron profiles in silicon," Nuclear Instruments and Methods in Physics Research B, vol. 186, 2002, pp. 287-291.

Gelpey et al., "Flash Lamp Annealing," Mattson Technology Canada Inc., Jul. 14, 2005, 35 pages.

Junghahnel et al., "P-65: Advanced processing of ITO and IZO thin films on flexible glass," Society for Information Display, vol. 46, No. 1, May 21-Jun. 5, 2015, pp. 1378-1381.

Lue, "A multichannel flash tube implemented for large area annealing of ion implanted semiconductors," Vacuum, vol. 32, No. 12, 1982, pp. 713-718.

McMahon et al., "Flash-lamp annealing of semiconductor materials—Applications and process models," Vacuum, vol. 81, 2007, pp. 1301-1305.

Mok et al., "Experimental and simulation study of the flash lamp annealing for boron ultra-shallow junction formation and its stability," Materials Science and Engineering B, vol. 154-155, 2008, pp. 14-19.

Ohdaira et al., "Drastic suppression of the optical reflection of flash-lamp-crystallized poly-Si films with spontaneously formed periodic microstructures," Thin Solid Films, 2010, 24 pages.

Ohdaira et al., "Flash-lamp-crystallized polycrystalline silicon films with remarkably long minority carrier lifetimes," Current Applied Physics, 2010, 4 pages.

Ohdaira et al., "Formation of micrometer-order-thick poly-Si films on textured glass substrates by flash lamp annealing of a-Si films prepared by catalytic chemical vapor deposition," Journal of Crystal Growth, vol. 311, 2009, pp. 769-772.

Ohdaira et al., "Precursor Cat-CVD a-Si films for the formation of high-quality poly-Si films on glass substrates by flash lamp annealing," Thin Solid Films, vol. 517, 2009, pp. 3472-3475.

Ohdaira et al., "Poly-Si films with long carrier lifetime prepared by rapid thermal annealing of Cat-CVD amorphous silicon thin films," Thin Solid Films, vol. 516, 2008, pp. 600-603.

Panknin et al., "Correlation of electrical and microstructural properties after high dose aluminium implantation into 6H-SiC," Materials Science and Engineering B, vol. 61-62, 1999, pp. 363-367.

Panknin et al., "The beneficial role of flash lamp annealing on the epitaxial growth of the 3C-SiC on Si," Applied Surface Science, vol. 184, 2001, pp. 377-382.

Pecz et al., "Crystallization of amorphous-Si films by flash lamp annealing," Applied Surface Science, vol. 242, 2005, pp. 185-191.

Satta et al., "Formation of germanium shallow junction by flash annealing," Nuclear Instruments and Methods in Physics Research B, vol. 257, 2007, pp. 157-160.

Shoemaker et al., "Rapid thermal processing of nano-crystalline indium tin oxide transparent conductive oxide coatings on glass by flame impingement technology," Thin Solid Films, vol. 517, 2009, pp. 3053-3056.

Skorupa et al., "Advanced thermal processing of semiconductor materials in the millisecond range," Vacuum, vol. 78, 2005, pp. 673-677.

Skorupa et al., "Millisecond annealing with flashlamps: Tool and process challenges," 14th International Conference on Advanced Thermal Processing of Semiconductors, RTP 2006, 9 pages.

Burrows et al., U.S. Appl. No. 14/934,664, Non-Final Office Action dated Sep. 7, 2017, 10 pages.

Skorupa, "Short time thermal processing: From electronics via photonics to pipe organs of the 17th century," Materials Science Forum, vol. 573-574, 2008, pp. 417-428.

Skorupa et al., "Ultra-shallow junctions produced by plasma doping and flash lamp annealing," Materials Science and Engineering B, vol. 114-115, 2004, pp. 358-361.

Smith et al., "Modelling of flash-lamp-induced crystallization of amorphous silicon thin films on glass," Journal of Crystal Growth, vol. 285, 2005, pp. 249-260.

Smith et al., "Regrowth mechanisms in flash lamp processing of heteroepitaxial SiC on silicon substrates," Journal of crystal Growth, vol. 277, 2005, pp. 162-169.

Unknown, "Large area transparent and conductive metal oxide thin films on glass made with an intermediate temperature post-deposition heat treatment in air," Defensive Publication Serial No. 000242912, retrieved from <http://ip.com/IPCOM/00242912>, Aug. 28, 2015, 3 pages.

Voelskow et al., "Controlled localised melting in silicon by high dose germanium implantation and flash lamp annealing," Nuclear Instruments and Methods in Physics Research B, vol. 267, 2009, pp. 1269-1272.

Voelskow et al., "Subsecond melt processing for achieving SiGe layers," Current Applied Physics, vol. 10, 2010, pp. 1309-1312.

Zechner et al., "Simulation of dopant diffusion and activation during flash lamp annealing," Materials Science and Engineering B, vol. 154-155, 2008, pp. 20-23.

Burrows et al., U.S. Appl. No. 14/934,686 entitled "Insulating Glass Unit Transparent Conductivity and Low Emissivity Coating Technology," filed Nov. 6, 2015, and published as US Publication No. 2016/0060948 on Mar. 3, 2016, 43 pages.

Burrows et al., U.S. Appl. No. 14/934,664 entitled "Insulating Glass Unit Transparent Conductive Coating Technology," filed Nov. 6, 2015, and published as US Publication No. 2016/0060949 on Mar. 3, 2016, 42 pages.

International Pat. App. No. PCT/US2016/056523, International Search Report and Written Opinion dated Dec. 15, 2016, 12 pages.

Viyli et al., U.S. Appl. No. 13/006,992 entitled "High Quality Emission Control Coatings, Emission Control Glazings, and Production Methods," filed Jan. 14, 2011, and issued as U.S. Pat. No. 8,658,262 on Feb. 25, 2014, 33 pages.

Viyli et al., U.S. Appl. No. 14/185,287 entitled "High Quality Emission Control Coatings, Emission Control Glazings, and Production Methods," filed Feb. 20, 2014, and issued as U.S. Pat. No. 9,453,365 on Sep. 27, 2016, 33 pages.

Pfaff et al., U.S. Appl. No. 14/807,624 entitled "Tin Oxide Overcoat Indium Tin Oxide Coatings, Coated Glazings, and Production Methods," filed Jul. 23, 2015, and published as US Publication No. 2015/0329417 on Nov. 19, 2015, 37 pages.

Chaudhuri et al., "Microstructure of indium tin oxide films produced by the D.C. sputtering technique," Thin Solid Films, vol. 148, No. 3, Apr. 1987, pp. 279-284.

Davis, "Properties of transparent conducting oxides deposited at room temperature," Thin Solid Films, vol. 236, No. 1-2, Dec. 15, 1993, pp. 1-5.

Gordon, "Criteria for Choosing Transparent Conductors," MRS Bulletin, Aug. 2000, pp. 52-57.

Mitsui et al., "Optical and Electrical Properties of SiO2-Overcoated ITO Films for Automotive Windows," Asahi Glass Research Reports, Asahi Glass Co., Ltd., vol. 54, 2004, pp. 11-15.

Sebastien et al., International Patent Application No. PCT/FR2015/051671, entitled Anti-Condensation Glazing Unit, filed Jun. 23, 2015, English Machine Translation, 19 pages.

FLASH-TREATED INDIUM TIN OXIDE COATINGS, PRODUCTION METHODS, AND INSULATING GLASS UNIT TRANSPARENT CONDUCTIVE COATING TECHNOLOGY

PRIORITY

This application is a continuation-in-part of U.S. Utility application Ser. No. 14/185,287, filed on Feb. 20, 2014, which is a continuation of U.S. Utility application Ser. No. 13/006,992, filed on Jan. 14, 2011 and now issued as U.S. Pat. No. 8,658,262, which claims priority to U.S. Provisional Application No. 61/295,694, filed on Jan. 16, 2010.

FIELD OF THE INVENTION

The present invention relates generally to thin film coatings for glass and other substrates. More particularly, this invention relates to flash-treated transparent electrically conductive coatings based on indium tin oxide.

BACKGROUND OF THE INVENTION

A variety of transparent electrically conductive oxide ("TCO") coatings are known in the art. In some cases, these coatings include an indium tin oxide ("ITO") film. To obtain a desired balance of electrical conductivity and visible transmission, ITO-based coatings are often heat treated. Known heat treatments include furnace heating, laser irradiation, flame treatment, and flash lamp treatment. Flash lamp treatment is beneficial in that it heat treats a large area of the coating with a single flash while the underlying substrate remains relatively cool.

It would be desirable to provide transparent electrically conductive coatings based on ITO that facilitate improved properties upon flash treatment. It would be particularly desirable to provide flash-treated transparent electrically conductive coatings based on ITO that provide combinations of properties improved for use on one or two exterior surfaces of a multiple-pane insulating glazing unit. It would also be desirable to provide transparent electrically conductive coatings designed for ultra-high-power flash treatment that produces flash-treated ITO-based coatings having an improved combination of properties.

It would be desirable, for example, to provide a flash-treated ITO film that has specific combinations of thickness, optical properties, and high electrical conductivity. It would also be desirable to provide a flash-treated ITO film that has pre and post flash optical bandgaps enabling good absorption, during the flash, of radiation in the range of 370-400 nm. In addition, it would be desirable to provide a flash-treated ITO film having a particular morphology that results from ultra-high-power flash treatment. The resulting film preferably would have surface roughness, carrier concentration, and absorption properties that are particularly advantageous for use on one or both exterior surfaces of a multiple-pane insulating glazing unit.

SUMMARY OF THE INVENTION

Figure 1:
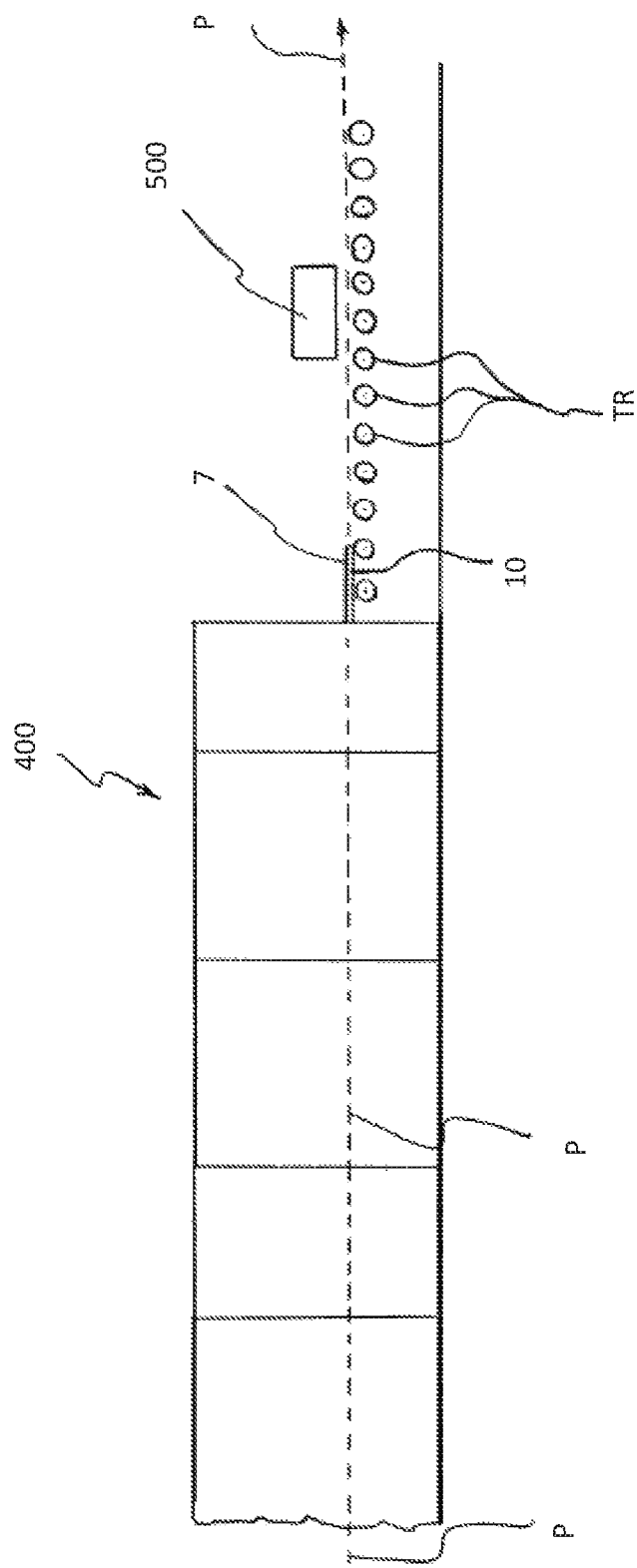
FIG. 1 is a broken-away schematic side view of a production line in accordance with certain embodiments of the present invention.

In some embodiments, the invention provides a method of producing coated glass. The method involves providing a glass pane having opposed first and second surfaces. The method further involves sputtering a metallic indium tin target in an oxidizing atmosphere so as to deposit a substoichiometric indium tin oxide film on the first surface of the glass pane, thereby producing a coated glass pane. The substoichiometric indium tin oxide film has a thickness of less than 1,800 Å, a surface roughness of less than 3 nm, an optical bandgap of 400 nm or longer, and a carrier concentration of $5 \times 10^{20}/cm^3$ or less. The method further includes flash treating the substoichiometric indium tin oxide film so as to produce a flash-treated indium tin oxide film. The flash-treated indium tin oxide film has a thickness of less than 1,800 Å, a surface roughness of less than 3 nm, an optical bandgap of 370 nm or shorter, a carrier concentration of $9\times10^{20}/cm^3$ or more, and a sheet resistance of less than 15 Ω/square in combination with providing the coated glass pane with a monolithic visible transmittance of greater than 0.82.

Certain embodiments of the invention provide a method of producing coated glass. The method involves providing a glass pane having opposed first and second surfaces. The method further involves sputtering a metallic indium tin target in an oxidizing atmosphere so as to deposit a substoichiometric indium tin oxide film on the first surface of the glass pane, thereby producing a coated glass pane. The substoichiometric indium tin oxide film has a thickness of greater than 100 Å but less than 1,500 Å, a surface roughness of greater than 1.5 nm but less than 3 nm, and an optical bandgap of 400 nm or longer. The method further includes flash treating the substoichiometric indium tin oxide film so as to produce a flash-treated indium tin oxide film. In the present embodiments, the flash treatment is an UHP flash treatment at a peak pulse power of 15-45 $kW/cm^2$. The flash-treated indium tin oxide film has a thickness of greater than 100 Å but less than 1,500 Å, a surface roughness of greater than 1.5 nm but less than 3 nm, an optical bandgap of 370 nm or shorter, and a sheet resistance of less than 30 Ω/square in combination with providing the coated glass pane with a monolithic visible transmittance of greater than 0.85.

Some embodiments of the invention provide a multiple-pane insulating glazing unit that includes a plurality of glass panes and a between-pane space. A desired one of the glass panes has an internal surface that is exposed to the between-pane space. This internal surface has a flash-treated transparent conductive oxide coating, such that the desired glass pane is a coated glass pane. This coated glass pane is annealed glass having a surface stress of less than 3,500 psi. The coating includes a flash-treated indium tin oxide film and an overcoat film on the flash-treated indium tin oxide film. The flash-treated indium tin oxide film has a thickness of less than 1,800 Å. The flash-treated indium tin oxide film is a sputtered film having a surface roughness of less than 3 nm. The flash-treated indium tin oxide film has a sheet resistance of less than 30 Ω/square in combination with the coated glass pane having a monolithic visible transmittance of greater than 0.82. The flash-treated indium tin oxide film has an optical bandgap of 370 nm or shorter and is characterized by a pre-flash optical bandgap of 400 nm or longer.

DETAILED DESCRIPTION OF PREFERRED EMBODIMENTS

The following detailed description is to be read with reference to the drawings, in which like elements in different drawings have like reference numerals. The drawings, which are not necessarily to scale, depict selected embodiments and are not intended to limit the scope of the invention. Skilled artisans will recognize that the examples provided herein have many useful alternatives that fall within the scope of the invention.

The invention provides methods for producing a coated substrate. The methods involve depositing a transparent conductive coating onto a substrate and flash treating the coated substrate. Preferably, the coating is deposited by sputter deposition. In other cases, the coating is deposited by chemical vapor deposition, spray pyrolysis, sol-gel deposition, atomic layer deposition (ALD), or pulsed laser deposition. Once the coating has been deposited, it is flash treated. The present method preferably uses an ultra-high-power flash treatment system. The terms "ultra-high-power flash treatment" and "UHP flash treatment" are defined for purposes of the present disclosure to mean flash treatment at a peak pulse power of 15 $kW/cm^2$ or greater. It will be appreciated that this is higher than the peak pulse powers commonly reported for conventional flash lamp treatment.

Thus, a substrate having a surface is provided. If desired, this surface can be prepared by suitable washing or chemical preparation. A variety of substrate types are suitable for use in the invention. In some cases, the substrate is a sheet-like substrate having opposed first and second surfaces, which can optionally be rectangular. The substrate can be a sheet of transparent material (i.e., a transparent sheet). The substrate, however, is not required to be transparent.

For many applications, the substrate will comprise a transparent (or at least translucent) material, such as glass or clear plastic. For example, the substrate is a glass sheet (e.g., a window pane) in certain embodiments. A variety of known glass types can be used, such as soda-lime glass. In some cases, it may be desirable to use "white glass," a low iron glass, etc. In certain embodiments, the substrate is part of a window, door, skylight, or other glazing. Depending on the level of solar control desired, the present coating may be applied to tinted glass. Thus, the coating of any embodiment disclosed herein can optionally be provided on a sheet of tinted glass. This may provide particularly good selectivity.

Substrates of various sizes can be used in the present invention. Commonly, large-area substrates are used. Certain embodiments involve a substrate having a major dimension (e.g., a length or width) of at least about 0.5 meter, preferably at least about 1 meter, perhaps more preferably at least about 1.5 meters (e.g., between about 2 meters and about 4 meters), and in some cases at least about 3 meters. In some embodiments, the substrate is a jumbo glass sheet having a length and/or width that is between about 3 meters and about 10 meters, e.g., a glass sheet having a width of about 3.5 meters and a length of about 6.5 meters. Substrates having a length and/or width of greater than about 10 meters are also anticipated. In some embodiments, the substrate is a continuous ribbon, such as a float glass ribbon emanating from a float glass production line or a ribbon on a roll-to-roll system.

Substrates of various thicknesses can be used in the present invention. In some embodiments, the substrate (which can optionally be a glass sheet) has a thickness of 1-14 mm, such as 2-14 mm. Certain embodiments involve a substrate with a thickness of between about 2.3 mm and about 4.8 mm, and perhaps more preferably between about 2.5 mm and about 4.8 mm. In one particular embodiment, a sheet of soda-lime glass with a thickness of about 3 mm is used.

The substrate (10 or 10') has opposed surfaces (12 and 14, or 16 and 18), which preferably are major surfaces (as opposed to edge surfaces). In some cases, surface 16 is destined to be an internal surface exposed to a between-pane space of an insulating glazing unit, while surface 18 is destined to be an external surface exposed to an interior of a building. This, however, need not be the case in all embodiments.

The coating 7 is deposited onto a surface (12, 14, 16, or 18) of a substrate (10 or 10'), e.g., as one or more discrete layers, as one or more thicknesses of graded film, or as a combination including at least one discrete layer and at least one thickness of graded film. Preferably, the present method involves sputtering, e.g., DC magnetron sputtering, which is a well-known deposition technique. Reference is made to Chapin's U.S. Pat. No. 4,166,018, the teachings of which are incorporated herein by reference. In some cases, the coating 7 is deposited by AC or pulsed DC sputtering from a pair of cathodes. HiPIMS and other modern sputtering methods can be used as well.

Briefly, magnetron sputtering involves transporting a substrate (10 or 10') through one or more low pressure zones (or "chambers" or "bays") in which the one or more film regions that make up the coating 7 are sequentially applied. To deposit oxide film, the target(s) may be formed of an oxide itself, and the sputtering may proceed in an inert or oxidizing atmosphere. To deposit indium tin oxide, for example, a ceramic indium tin oxide target can be sputtered in an inert or oxidizing atmosphere. Alternatively, oxide film can be deposited by sputtering one or more metallic targets (e.g., of metallic indium tin material) in a reactive atmosphere. Tin oxide can be deposited by sputtering one or more tin targets in a reactive atmosphere containing oxygen gas. Silicon nitride can be deposited by sputtering one or more silicon targets (which may be doped with aluminum or the like to improve conductivity) in a reactive atmosphere containing nitrogen gas. Silicon oxynitride can be deposited by sputtering one or more silicon targets (which may likewise be doped with aluminum or the like) in a reactive atmosphere containing both oxygen and nitrogen gas. Silicon dioxide can be deposited by sputtering one or more silicon targets (which may likewise be doped with aluminum or the like) in a reactive atmosphere containing oxygen gas. Titanium dioxide can be deposited by sputtering one or more titanium targets (which may be doped with tungsten or the like) in a reactive atmosphere containing oxygen gas, or by sputtering titanium sub-oxide targets in an inert gas, a reactive gas, or a mixture of both. The thickness of the deposited film(s) can be controlled by varying the speed of the substrate, by varying the power on the targets, and/or by varying the ratio of power to partial pressure of the reactive gas.

In one example, a pair of rotatable ceramic indium tin oxide targets is sputtered while an uncoated glass substrate is conveyed past the activated targets at a rate of about 36 inches per minute. The relative weight amount of the two metals is: indium 90%, tin 10%. A power of 16 kW is used, and the sputtering atmosphere is 5 mTorr with a gas flow of 900 sccm argon and 10 sccm oxygen. The resulting substoichiometric indium tin oxide film has a thickness of about 1,100 Å. Directly over this film, a silicon nitride overcoat film is applied. The silicon nitride is applied at a thickness of about 560 Å by conveying the glass sheet at about 36 inches per minute past a pair of rotary silicon aluminum targets (83% Si, 17% Al, by weight) sputtered at a power of 31.2 kW in a 5 mTorr atmosphere with a gas flow 920 sccm nitrogen. For the as-deposited film, the visible absorption is about 8.5%, the optical bandgap is about 430 nm, the carrier concentration is about $1.5 \times 10^{20}/cm^3$, and the surface roughness is about 2.7 nm.

In another example, a pair of rotatable metallic indium tin targets is sputtered while an uncoated glass substrate is conveyed past the activated targets at a rate of about 60 inches per minute. The relative weight amount of the two metals is: indium 90%, tin 10%. A power of 16 kW is used for the pair of rotary targets. The sputtering atmosphere is 5 mTorr with a gas flow of 601 sccm argon and 100 sccm oxygen. The resulting substoichiometric indium tin oxide film has a thickness of about 1,240 Å. Directly over this ITO film, a silicon nitride overcoat film is applied. The silicon nitride is applied at a thickness of about 600 Å by conveying the glass sheet at about 60 inches per minute sequentially past a pair of rotary silicon aluminum targets (83% Si, 17% Al, by weight) sputtered at 38.6 kW in a 5 mTorr atmosphere with a gas flow 450 sccm argon and 451 sccm nitrogen. For the as-deposited film, the visible absorption is about 10.5%, the optical bandgap is about 420 nm, the carrier concentration is about $2.5 \times 10^{20}/cm^3$, and the surface roughness is about 2.9 nm.

The foregoing examples are by no means required. Many other sputter deposition processes can be used to deposit the coating 7 onto the substrate (10 or 10'). Moreover, chemical vapor deposition, spray pyrolysis, sol-gel deposition, atomic layer deposition (ALD), or pulsed laser deposition can alternatively be used.

FIG. 1 schematically depicts a production line having both a sputter coater 400 and a flash treatment device 500. Here, the flash treatment device 500 is located on the production line downstream of the coater 400. The flash treatment device can alternatively be located within the coater. Another possibility is to provide the flash treatment device 500 on a processing line separate from the sputter coater 400. The flash treatment device 500, for example, may be in a facility different from the coating facility. Either way, the sputtering line 400 will typically include a series of connected sputter deposition chambers through which a path of substrate travel P extends. The path of substrate travel P can be defined, for example, by a series of spaced-apart transport rollers TR.

The flash treatment device 500 preferably has a single row of flash lamps, although this is not strictly required. The flash lamps can be, for example, xenon flash lamps each having a diameter larger than 15 mm. The flash lamps can be spaced apart by, for example, about three inches on center across the width of the system, with the axis of the lamp aligned in the direction of travel of the substrate. As one non-limiting example, for a 96 inch width of treated glass area, 32 lamps may be used. The lamps preferably each have a length of six inches, although other lengths (e.g., longer lengths) can alternatively be used. A concentrating reflector is mounted behind each lamp, e.g., such that the lamp uniformly illuminates a 3 inch×6 inch area (or, in the case of longer lamp lengths, larger areas can be uniformly illuminated).

As another possibility, the flash treatment device 500 can include one or more lamps each having their axis cross-wise to the direction of substrate travel. Lamps of various lengths can be used in such cases, depending upon the requirements of a given system and its intended applications.

The present flash treatment preferably involves a peak pulse power of 15 kW/cm$^2$ or greater, e.g., in the range of 15-45 kW/cm$^2$, or even 20 kW/cm$^2$ or greater, e.g., in the range of 20-45 kW/cm$^2$. Thus, the present flash treatment preferably is UHP flash treatment. Thus, the flash-treated indium tin oxide film may have a morphology characterized by UHP flash-treatment at 15-45 kW/cm$^2$. Due to the rapid temperature change of the film, a distinctive average stress condition may result.

When the device 500 flashes, it preferably emits a pulse packet of between 1 and 20 pulses. These pulses can be as long as 5 milliseconds, but preferred recipes involve 5-15 pulses, each being between 50 and 200 microseconds, with an off-time in the range of 50-100 microseconds between each pulse. One exemplary pulse packet is about 2 milliseconds in length (including on and off time). The pulse is powered by a charged capacitor bank. The energy contained in the pulse is affected by the length of the pulse, as well as the voltage at which the capacitors have been charged. The voltage range preferably is between 650 V and 950 V. The total energy contained in a pulse packet is up to about 30 J/cm$^2$, and preferably is in the range of from 18 J/cm$^2$ to 24 J/cm$^2$. The peak power of the pulse preferably is 15 kW/cm$^2$ or greater, e.g., in the range of 15-45 kW/cm$^2$, or even 20 kW/cm$^2$ or greater, e.g., in the range of 20-45 kW/cm$^2$.

The system is able to flash up to approximately two such pulse packets per second (limited by the capacitor recharging rate). A single pulse packet is sufficient to convert the film, but there may be some overlap of pulse packets (e.g., 10%) to ensure the film is fully treated. In certain embodiments, each pulse treats 6 inches in the direction of travel (preferably with a 10% overlap), and the line speed is as high as about 650 inches per minute (e.g., 5.4+5.4=10.8 inches per second). Equipment of this nature is commercially available from Ncc Nano LLC of Austin, Tex., U.S.A.

Thus, the invention provides a method for producing flash-treated coated glass. The method involves providing a glass substrate (10 or 10') having opposed first (12 or 18) and second (14 or 16) surfaces. An indium tin oxide film 20 is deposited onto a surface (12, 14, 16, or 18) of the glass pane (10 or 10'). The indium tin oxide film 20, as deposited, is a sub-oxide (i.e., its oxygen content is substoichiometric). The deposition technique can be, for example, in accordance with either of the two non-limiting sputter deposition examples detailed above. Other deposition methods can alternatively be used. Preferably, the method involves sputtering a metallic indium tin target in an oxidizing atmosphere. One such deposition technique is the second of the two non-limiting sputter deposition examples detailed above. The substoichiometric indium tin oxide film (i.e., the film 20 as deposited) has a thickness of less than 1,800 Å, a surface roughness of less than 3 nm, an optical bandgap of 400 nm or longer, and optionally a carrier concentration of 5×10$^{20}$/cm$^3$ or less.

Thus, the thickness of the substoichiometric indium tin oxide film (i.e., the film 20 as deposited) is less than 1,800 Å, such as between 100 Å and 1,800 Å. In some cases, the thickness is less than 1,600 Å, such as between 100 Å and 1,600 Å, or even less than 1,500 Å, such as greater than 100 Å but less than 1,500 Å. In preferred embodiments, the thickness is between 1,050 Å and 1,450 Å. Any embodiment disclosed herein can provide the thickness of film 20 in this range. The thicknesses recited herein are physical thicknesses unless otherwise specified to be optical thicknesses. Thus, in some embodiments, the substoichiometric indium tin oxide film (i.e., the film 20 as deposited) has a thickness of less than 1,500 Å, a surface roughness of less than 3 nm, an optical bandgap of 400 nm or longer, and optionally a carrier concentration of 5×10$^{20}$/cm$^3$ or less.

As noted above, the substoichiometric indium tin oxide film (and the coating 7) has a surface roughness $R_a$ of less than 3 nm. In preferred embodiments, the surface roughness $R_a$ is between 1.5 nm and 3 nm, such as between 2.0 nm and 3.0 nm. Surface roughness is defined in terms deviations from the mean surface level. The surface roughness $R_a$ is the arithmetical mean surface roughness. This is the arithmetic average of the absolute deviations from the mean surface level. The arithmetical mean surface roughness of a coating is commonly represented by the equation: $R_a = 1/L \int_0^L |f(x)| dx$. The surface roughness $R_a$ can be measured in conventional fashion, e.g., using an Atomic Force Microscope (AFM) equipped with conventional software that gives $R_a$. Thus, in some embodiments, the substoichiometric indium tin oxide film (i.e., the film 20 as deposited) has a thickness of greater than 100 Å but less than 1,500 Å, a surface roughness of between 1.5 nm and 3 nm, an optical bandgap of 400 nm or longer, and optionally a carrier concentration of 5×10$^{20}$/cm$^3$ or less.

In connection with the optical bandgap of the substoichiometric indium tin oxide film, because it is 400 nm or longer (and hence in the visible region), the film 20 as deposited has lower transmission in the visible range. The optical bandgap determines the portion of the solar spectrum that the indium tin oxide film 20 will absorb; photons with an energy level less than that of the bandgap are not absorbed. The optical bandgap can be determined from the optical absorption spectrum of the material using a Tauc Plot. This method is well known to skilled artisans. In any embodiment of the present disclosure, the optical bandgap of the substoichiometric indium tin oxide film can optionally be 410 nm or longer, or even 420 nm or longer.

The carrier concentration of the indium tin oxide film 20 is relatively low as deposited. Thus, the as-deposited film is not very conductive. In certain preferred embodiments, the film 20 is deposited so its carrier concentration is 5×10$^{20}$/cm$^3$ or less, such as in the range of about 1-2.5×10$^{20}$/cm$^3$. The carrier concentration can be determined using the van der Pauw Method, which is well known to skilled artisans.

In addition, the substoichiometric indium tin oxide film preferably is non-porous, or at least substantially non-porous. Porosity is a measure of the volume fraction of voids (empty space or a gas or liquid phase separate from the film material) in a film, also called the void fraction.

It is to be appreciated, however, that it is merely optional to provide the film 20 in non-porous or substantially non-porous form. Another option is to have higher amounts of porosity. While this may decrease the electrical conductivity of the film 20, it may also reduce its index of refraction, which may be advantageous for certain applications. Porosity can be provided using methods well known to skilled artisans, such as increasing the pressure during sputtering.

The method further includes flash treating the substoichiometric indium tin oxide film so as to produce a flash-treated indium tin oxide film. The flash treatment equipment and process parameters described above can optionally be used. While an UHP technique is preferred, it is not required. Similarly, the equipment arrangement details discussed above are optional. Skilled artisans will be able to readily design and use many other flash treatment equipment arrangements and process parameters given the present teaching as a guide.

The flash-treated indium tin oxide film has a thickness of less than 1,800 Å, a surface roughness of less than 3 nm, an optical bandgap of 370 nm or shorter, optionally a carrier concentration of 9×10$^{20}$/cm$^3$ or more, and a sheet resistance of less than 30 Ω/square (in some cases, less than 15 Ω/square) in combination with providing the coated glass substrate with a monolithic visible transmittance of greater than 0.82, or even greater than 0.85.

The flash treatment advantageously crystallizes the indium tin oxide film 20, improves grain size, heals intra-grain defects, oxidizes the film (and decreases visible absorption), optionally together with activating dopant(s) in the film. As noted above, the carrier concentration of the as-deposited indium tin oxide film is relatively low. It is therefore not very conductive. And because its optical bandgap is in the visible region, the film 20 as deposited has lower transmission in the visible range. As a result of the flash treatment, the optical bandgap of the film 20 shifts to a higher energy/shorter wavelength. By shifting the bandgap from 400 nm or longer (pre-flash) to 370 nm or shorter (post-flash), the indium tin oxide film 20 is capable of absorbing energy emitted by the flash in the 370 to 400 nm range. The mechanism that causes the bandgap to shift when the carrier concentration increases is the Burstein Moss Effect.

The flash treatment preferably produces a carrier concentration factor of at least 5. That is, the carrier concentration of the flash-treated indium tin oxide film preferably is at least 5 times greater than the carrier concentration of the substoichiometric indium tin oxide film (i.e., the film 20 as deposited). In some embodiments, the carrier concentration factor is at least 7.5.

The carrier concentration of the as-deposited film can optionally be in the range of $1\text{-}2.5 \times 10^{20}/cm^3$. The flash treatment provides a great carrier concentration increase. In certain preferred embodiments, the carrier concentration of the flash-treated indium tin oxide film is $9 \times 10^{20}/cm^3$ or more, such as in the range of $9\text{-}13 \times 10^{20}/cm^3$. It is to be appreciated, however, that the preferred carrier concentrations and carrier concentration factors noted in this paragraph and the preceding paragraph are optional.

The flash treatment lowers the sheet resistance of the indium tin oxide film 20. The post-flash sheet resistance is less than 30 Ω/square, such as 5-285 Ω/square. In certain preferred embodiments, it is less than 15 Ω/square, less than 14 Ω/square, or even less than 13 Ω/square, such as 10-13 Ω/square. Sheet resistance can be measured in standard fashion using a non-contact sheet resistance meter.

The flash treatment preferably produces a controlled ΔA for the indium tin oxide film 20. The term ΔA is defined, for purposes of the present disclosure, as being the magnitude of the reduction of the visible absorption of the indium tin oxide film 20 caused by the flash treatment. As is well-known to skilled artisans, visible absorption (expressed as a percentage) equals 100 minus $T_{vis}$ minus $R_{vis}$. Preferably, the ΔA is five percent or more, seven percent or more, or even nine percent or more. In certain preferred embodiments, the visible absorption of the substoichiometric indium tin oxide film (i.e., the film 20 as deposited) is greater than 7%, e.g., in the range of 7.5-12%. After flash treatment, the visible absorption preferably is less than 5%, such as 0.5-4.5%, perhaps optimally 1-4%.

The flash treatment can optionally be preceded by a step of pre-heating the coated glass. In some embodiments, prior to flash treating the coated substrate, it is heated to a temperature of greater than 50 degrees C., or even greater than 75 degrees C., such as about 100-125 degrees C. The optional preheating can be conducted using an electric furnace, a natural gas furnace, or infrared lamps. As just one example, a pre-heating system can optionally be positioned between the coater 400 and the flash-treatment device 500 in the embodiment of FIG. 1.

The flash treatment is advantageous in that it, while it heats the coating 7 to an extremely high temperature, the heating period is incredibly short, so the glass substrate (10 or 10') experiences relatively little heat gain. For example, the opposite surface of the glass pane is maintained at a temperature of 150 degrees C. or lower (preferably lower than 125 degrees C.) during the flash treatment. This is desirable for several reasons. First, the annealed state of a coated glass substrate can be maintained even after flash treatment; the glass can thus remain cut-able. Second, the glass is not subjected to the types of deformations (e.g., roller wave distortion) that can occur in conventional furnace tempering. Third, the time, energy, and cost savings are considerable.

The flash-treated indium tin oxide film has a low sodium concentration. Preferably, the sodium concentration is less than 100 ppm, less than 10 ppm, or even less than 1 ppm.

During heat treatment, sodium can migrate from substrate materials like soda-lime glass into an overlying coating. (In preferred embodiments, the or each glass substrate is soda-lime glass.) It is desirable to keep the ITO film 20 as sodium-free as possible. When a significant amount of sodium is present in an ITO film, its long term stability and performance may be negatively impacted. Since flash treatment subjects the glass substrate to far less heat than furnace tempering and other conventional heat treatments, the present flash method is beneficial in terms of avoiding sodium poisoning. The sodium concentration can be measured using secondary ion mass spectroscopy, which is a technique well known in the present field.

The thickness of the indium tin oxide film 20 after flash treatment is less than 1,800 Å, such as between 100 Å and 1,800 Å. In certain preferred embodiments, the thickness of the flash-treated indium tin oxide film is less than 1,600 Å (but greater than 100 Å), or even less than 1,500 Å (but greater than 100 Å), and yet its sheet resistance is less than 15 Ω/square, or even less than 13 Ω/square. The thickness can be, for example, between 1,050 Å and 1,800 Å, such as between 1,050 Å and 1,450 Å. In certain preferred embodiments, the thickness is in this range and the monolithic visible transmittance of the coated glass substrate (10 or 10') is greater than 0.86 but less than 0.92 while the sheet resistance of the flash-treated ITO film is greater than 10 Ω/square but less than 15 Ω/square (or less than 13 Ω/square).

In some embodiments, the flash-treated indium tin oxide film has a thickness of greater than 100 Å but less than 1,500 Å, a surface roughness of greater than 1.5 nm but less than 3 nm, an optical bandgap of 370 nm or shorter, optionally a carrier concentration of $9 \times 10^{20}/cm^3$ or more, and a sheet resistance of less than 30 Ω/square in combination with providing the coated glass pane with a monolithic visible transmittance of greater than 0.85.

In preferred embodiments, the present method further includes depositing an overcoat film onto the substoichiometric indium tin oxide film. When provided, the overcoat film preferably is sputter deposited to a thickness of between 100 Å and 1,300 Å. The overcoat film can be formed of various materials. For example, it can be formed of silicon nitride, silicon oxynitride, silicon dioxide, tin oxide, titanium oxide, or titanium oxynitride.

In certain embodiments, the overcoat film 100 is formed of an oxide material deposited directly onto the indium tin oxide film 20, and the indium tin oxide film is deposited directly onto a surface (12, 14, 16, or 18) of the glass substrate (10 or 10'). As noted above, the glass substrate preferably is soda-lime glass. In the present embodiments, even though the coating 7 does not have a sodium ion diffusion barrier layer, the flash-treated indium tin oxide film has a sodium concentration of less than 100 ppm, less than 10 ppm, or even less than 1 ppm.

Figure 2:
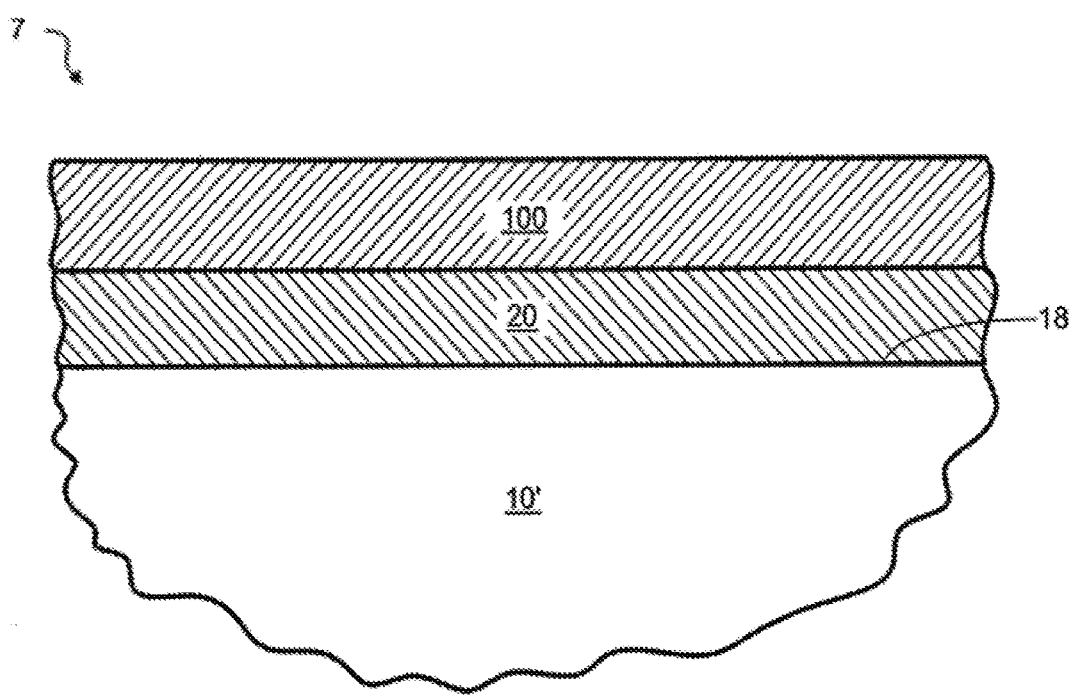
FIG. 2 is a broken-away schematic cross-sectional view of a substrate bearing a transparent electrically conductive coating in accordance with certain embodiments of the invention.
Figure 3:
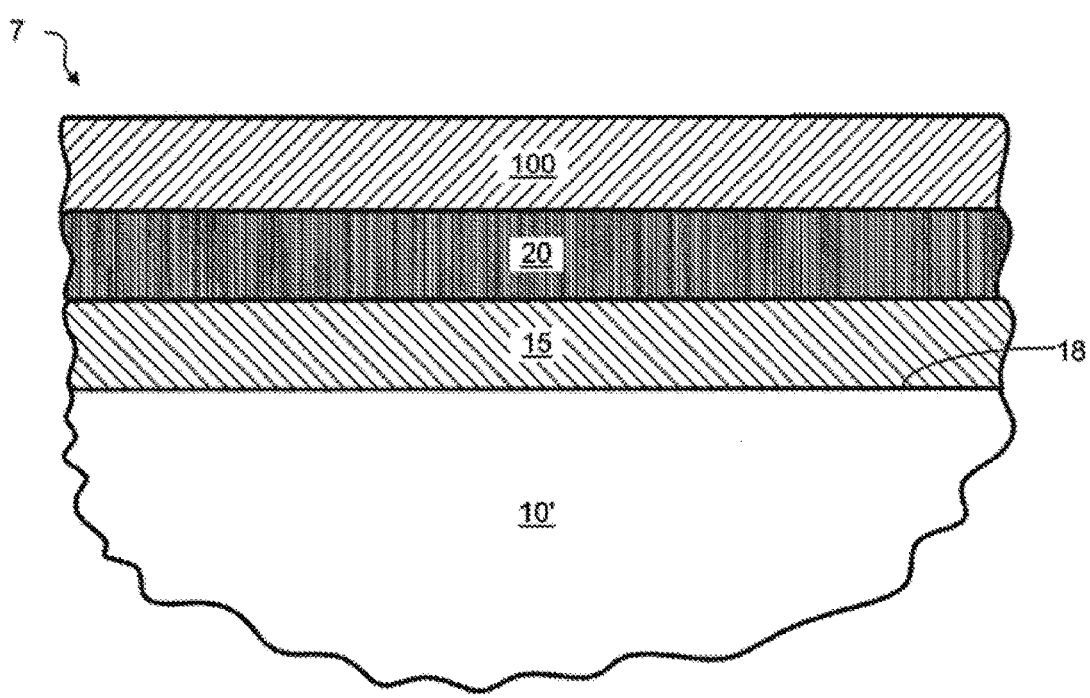
FIG. 3 is a broken-away schematic cross-sectional view of a substrate bearing a transparent electrically conductive coating in accordance with other embodiments of the invention.

Thus, the present invention provides a coated glass substrate having a flash-treated transparent electrically conductive coating. In FIGS. 2 and 3, substrate 10' bears a transparent electrically conductive coating 7. In these figures, the coating 7 includes a flash-treated indium tin oxide film 20 and an overcoat film 100. In the embodiment of FIG. 3, the coating 7 includes, from surface 18 outwardly, an optional base film 15, the flash-treated indium tin oxide film 20, and the overcoat film 100. Films 15, 20, and 100 can be provided in the form of discrete layers, thicknesses of graded film, or a combination of both including at least one discrete layer and at least one thickness of graded film. While the base film 15 is shown as a single layer, it can alternatively be a plurality of layers. Preferably, all the films in the coating 7 are oxide, nitride, or oxynitride films. Certain embodiments provide the coating 7 in the form of multiple layers of different oxide materials (e.g., such that that the coating 7 consists of a plurality of different oxide films). Preferably, all the films in the coating 7 are sputtered films.

Figure 4:
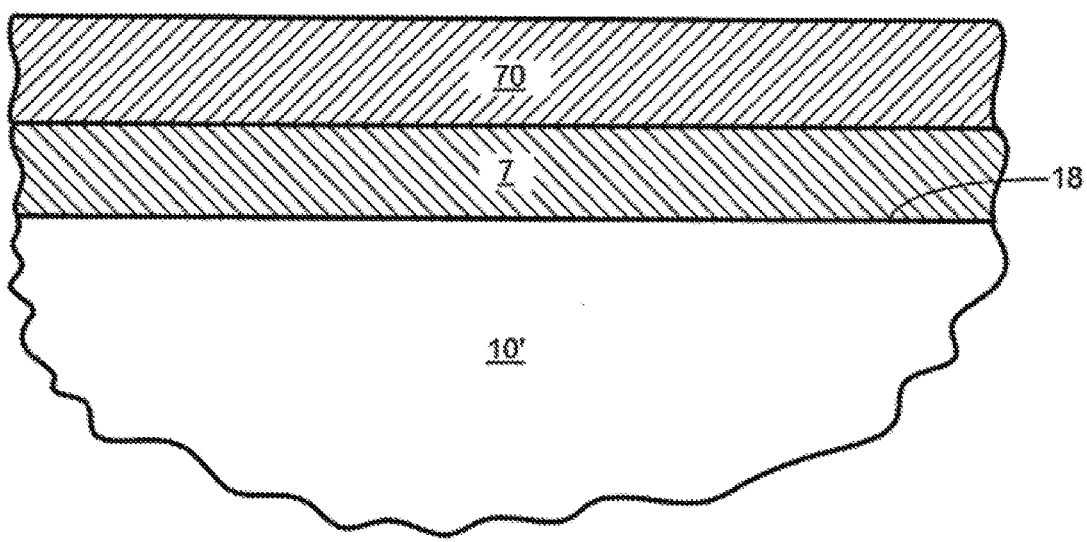
FIG. 4 is a broken-away schematic cross-sectional view of a substrate bearing a transparent electrically conductive coating and a titanium-oxide containing film in accordance with still other embodiments of the invention.

While FIGS. 2-4 show the coating 7 on surface 18 of substrate 10', this coating can alternatively be provided on surface 16 of substrate 10', on surface 12 of substrate 10, or on surface 14 of substrate 10. More generally, the present disclosure contemplates the flash-treated coating 7 being provided on any surface of a glass substrate, whether or not it is part of a multi-pane insulating glass unit. In embodiments where the coating 7 is on a pane that is part of an IG unit, this coating can either be on an external surface (such as a #1 surface or a #4 surface) of the IG unit or on an internal surface (such as a #2 surface or a #3 surface) of the IG unit.

The coating 7 preferably is formed of materials, and made by a process (such as one of those described above), that allow the coated substrate to have a haze level of less than 0.5 or less than 0.3 (e.g., less than 0.2, less than 0.1, or even less than 0.09), a roughness $R_a$ of less than 3 nm, and a monolithic visible transmittance of greater than 0.82 (preferably greater than 0.85, or even greater than 0.86). It is to be appreciated, however, that these properties are optional. For example, higher haze levels may be provided in certain embodiments.

Haze can be measured in well-known fashion, e.g., using a BYK Haze-Gard plus instrument. Reference is made to ASTM D 1003-00: Standard Test method for Haze and Luminous Transmittance of Transparent Plastics, the contents of which are incorporated herein by reference.

In certain preferred embodiments, the coated substrate has a haze of less than 0.3 and a surface roughness of less than 3 nm, together with a monolithic visible transmittance (after flash treatment) of greater than 0.82, or even greater than 0.85, in combination with the flash-treated ITO film having a $R_{sheet}$ of less than 15 ohms/square, or even less than 13 ohms/square, such as about 11.5 to 12.5 ohms/square.

As noted above, the coating 7 has low surface roughness. Preferably, the flash-treated coating has a surface roughness $R_a$ of less than 3 nm, such as from 1.5 nm to 3.0 nm. The deposition method parameters preferably are chosen to provide the coating with such a roughness. Alternatively, the coating could be polished or roughened after deposition to provide the desired surface roughness. While the flash treatment may increase the surface roughness by a certain amount (e.g., 0-10%), the final surface roughness preferably is in the ranges noted above.

The flash treated coated substrate can have particularly good flatness. For example, the coated glass substrate of any embodiment of this invention can, even after flash treatment, meet the specifications for allowable annealed glass distortion specified in ASTM 1036-11, the teachings of which are hereby incorporated herein by reference.

When provided, the optional base film 15 can comprise, consist essentially of, or consist of silica, alumina, or a mixture of both. In other embodiments, the base film 15 comprises titanium dioxide. In still other embodiments, the base film 15 comprises tin oxide (e.g., $SnO_2$). In such embodiments, the base film 15 may be devoid of indium. For example, a base film 15 consisting of (or at least consisting essentially of) tin oxide is provided in some cases. Compounds of two or more of silica, alumina, titanium dioxide, and tin oxide can be used. Alternatively, other dielectric films may be used. As noted above, the invention also provides embodiments wherein the base film is omitted.

The indium tin oxide film 20 comprises indium tin oxide, optionally together with one or more other materials. If desired, zinc, aluminum, antimony, fluorine, carbon nanotubes, or other components can be included in the film. Preferably, the indium tin oxide film 20 consists essentially of (e.g., contains more than 95% by weight), or consists of, indium tin oxide. The indium tin oxide film 20 can contain various relative percentages of indium and tin. On a metal-only basis, indium is the major constituent. That is, indium accounts for more than 50% of the film's total metal weight. Preferably, the composition of the film on a metal-only basis ranges from about 75% indium/25% tin to about 95% indium/5% tin, such as about 90% indium/10% tin.

In any embodiment of the present disclosure, the indium tin oxide film 20 can optionally be replaced with another type of transparent conductive oxide film. A few well-known examples include fluorinated tin oxide ("FTO"), a doped zinc oxide, such as aluminum-doped zinc oxide ("AZO"), or a doped titanium dioxide, such as niobium-doped $TiO_2$ ("NTO").

The overcoat film 100 is located over the indium tin oxide film 20. In some cases, the overcoat film 100 comprises tin oxide. In such cases, the tin oxide-containing overcoat film is devoid of indium oxide. In certain embodiments, the overcoat film 100 contains at least 75% tin, at least 85% tin, or at least 95% tin (on a metal-only basis), while also being devoid of indium oxide. For example, the overcoat film 100 may consist of (or at least consist essentially of) tin oxide (e.g., $SnO_2$). Alternatively, the overcoat film can comprise silicon nitride, silicon oxynitride, or both. Further, some embodiments provide the overcoat film 100 in the form of an oxide material, such as silicon dioxide.

The coating 7 can optionally include a nitride film between the indium tin oxide film 20 and the overcoat film 100. When provided, the nitride film may comprise one or more of silicon nitride, aluminum nitride, and titanium nitride. For example, a thin film of silicon nitride can optionally be positioned directly between (i.e., so as to contact both) the indium tin oxide film and the overcoat film. When provided, this silicon nitride film (which can optionally include a small amount of aluminum) may have a thickness of less than 250 Å, or even less than 200 Å, e.g., about 150 Å.

In other embodiments, the overcoat film 100 is in contact with the indium tin oxide film 20. Providing the overcoat film 100 directly over (i.e., so as to be in contact with) the underlying indium tin oxide film 20 can be advantageous. For example, providing fewer layers and interfaces may be desirable in connection with optical properties, stress, or both. Moreover, material, energy, and cost can be conserved by providing fewer layers. Also, when the overcoat film 100 comprises tin oxide, while it has a different composition than the indium tin oxide film 20, both contain tin oxide and may thus have particularly good adhesion to each other.

When provided, the optional base film 15 has a thickness of 50 Å or more, such as about 70-300 Å. In certain embodiments, the coating includes a base film of silica (optionally including some alumina), alumina, titanium dioxide, or tin oxide at a thickness of 75-150 Å. The invention also provides embodiments wherein the indium tin oxide film 20 is directly on (i.e., in contact with) the surface of the substrate, which may be soda-lime float glass.

The coating 7 can optionally further include an oxynitride film located on the overcoat film 100. When provided, this oxynitride film can have a thickness of between 100 Å and 1,300 Å, such as between 400 Å and 900 Å. The oxynitride film can optionally be directly over (i.e., so as to contact) the overcoat film 100. The oxynitride film may comprise aluminum, oxygen, and nitrogen. In some cases, the oxynitride film is an exposed outermost film of the coating 7.

In certain embodiments, the optional oxynitride film comprises silicon oxynitride at a thickness of between 400 Å and 900 Å. The silicon oxynitride may, for example, be sputter deposited from one or more silicon-aluminum targets, such as elemental targets comprising a sputterable material consisting of about 83% silicon and 17% aluminum.

Some embodiments of the invention provide a film comprising titanium oxide 70 over the transparent electrically conductive coating 7. Reference is made to FIG. 4. When provided, the film comprising titanium oxide 70 preferably is an exposed, outermost film. Thus, when both the optional oxynitride film and the optional film comprising titanium oxide 70 are provided, the film comprising titanium oxide preferably is located over the oxynitride film. In preferred embodiments, the film comprising titanium oxide 70 has a thickness of less than 200 Å, such as from 10-75 Å, e.g., about 50 Å.

When provided, the film comprising titanium oxide 70 preferably is photocatalytic, hydrophilic, or both. Suitable films of this nature are described in U.S. Pat. No. 7,294,404 and Ser. No. 11/129,820 and U.S. Pat. Nos. 7,713,632 and 7,604,865 and Ser. No. 11/293,032 and U.S. Pat. Nos. 7,862,910 and 7,820,309 and 7,820,296, the salient teachings of each of which are incorporated herein by reference.

In some embodiments, the coated substrate (10 or 10') is part of a monolithic glazing. In other embodiments, the coated substrate is part of a multi-pane insulating glazing unit ("IG unit") 110. Reference is made to FIGS. 5-10, which depict double-pane IG unit embodiments. It is to be appreciated that the IG unit 110 can alternatively have three or more panes.

The IG unit 110 includes two glass panes. The two panes respectively define two opposed external pane surfaces. In addition, the two panes respectively define two confronting internal pane surfaces. In the double-pane IG unit embodiments of FIGS. 5-10, the two panes 10, 10' respectively define two confronting internal pane surfaces 14, 16 that are both exposed to a single between-pane space 800. In triple-pane IG unit embodiments, the two panes that respectively define the two opposed external pane surfaces also respectively define two confronting internal pane surfaces, but those confronting internal pane surfaces are exposed to different between-pane spaces.

At least one external or internal pane surface of the IG unit has a flash-treated transparent conductive oxide coating, such that a desired one of the glass panes is a coated glass pane. This coated glass pane is annealed glass having a surface stress of less than 3,500 psi, preferably less than 3,000 psi, such as 2,500 psi or less. Surface stress can be determined using a grazing angle surface polarimeter as specified in ASTM C1048 and ASTM C1279, the teachings of which are incorporated herein by reference.

The IG unit 110, while shown as a double-pane unit, can alternatively be a triple-pane unit comprising three glass panes. In such cases, the middle pane can optionally be heat strengthened or tempered, while the two outer panes are annealed. Another option is for one or both of the outer panes of a triple-pane unit to be heat strengthened or tempered while the middle pane is annealed. Furthermore, in double-pane IG unit embodiments, the flash-treated coated glass pane can be annealed while the other glass pane is heat strengthened or tempered. Or, all the glass panes of any embodiment of the present disclosure can optionally be annealed.

Some embodiments provide an IG unit that includes at least one annealed glass pane and at least one tempered or heat strengthened glass pane, where the annealed glass pane has a flash-treated transparent electrically conductive coating 7 while the tempered or heat strengthened glass pane has its own transparent electrically conductive coating. In these embodiments, the two transparent electrically conductive coatings can optionally be different, e.g., they may have different layer stacks, different TCO film thicknesses, or just different TCO film morphologies or characteristics.

In one group of embodiments, the flash-treated transparent electrically conductive coating 7 is on a #4 surface, a #6 surface, or another external surface of the inboard pane of an IG unit. By providing the transparent electrically conductive coating 7 on this surface, the temperature of the indoor pane under certain conditions can be decreased. In such cases, by providing a photocatalytic and/or hydrophilic film comprising titanium oxide 70 over the transparent electrically conductive coating 7, any condensation that may occur on the room-side surface may be more readily formed into a sheet and evaporated. Reference is made to the embodiment shown in FIG. 6.

The "first" (or "#1") surface is exposed to an outdoor environment. Accordingly, it is the #1 surface that radiation from the sun first strikes. The external surface of the outboard pane is the so-called first surface. Moving from the #1 surface toward the interior of the building, the next surface is the "second" (or "#2") surface. Thus, the internal surface of the outboard pane is the so-called second surface. Moving further toward the interior of the building, the next surface is the "third" (or "#3") surface, followed by the "fourth" (or "#4") surface. This convention is carried forward for IG units having more than four major pane surfaces. Thus, for a triple-pane IG unit, the #6 surface would be the external surface of the inboard pane.

One group of embodiments provides a triple glazing (e.g., an IG unit having three panes), and the flash-treated transparent electrically conductive coating is provided on the #6 surface. In embodiments of this nature, the #1 and/or #2 surfaces can optionally have other functional coatings. The #2 surface, for example, may have a silver-based low-emissivity coating, and/or the #1 surface may have another transparent electrically conductive coating, a photocatalytic coating, an antireflection coating, or a UV-blocking coating. One example is a triple-pane IG unit having the flash-treated transparent electrically conductive coating provided on the #6 surface, a triple-silver low-emissivity coating on the #2 surface, and a single-silver low-emissivity coating on the #4 surface. Another example is a triple-pane IG unit having the flash-treated transparent electrically conductive coating provided on the #6 surface, a triple-silver low-emissivity coating on the #2 surface, and another transparent electrically conductive coating on the #4 surface.

In FIGS. 5-10, substrate 10' is a transparent glass pane that is part of an IG unit 110. The IG unit 110 has an exterior pane 10 and an interior pane 10' separated by at least one between-pane space 800. A spacer 900 (which can optionally be part of a sash) is provided to separate the panes 10 and 10'. The spacer 900 can be secured to the internal surfaces of each pane using an adhesive or seal 700. In some cases, an end sealant 600 is also provided. In the illustrated embodiments, the exterior pane 10 has an external surface 12 (the #1 surface) and an internal surface 14 (the #2 surface). The interior pane 10' has an internal surface 16 (the

3 surface) and, in some cases (i.e., when the IG unit is a double-pane unit), an external surface 18 (the #4 surface). In other embodiments, the IG unit 110 has three panes, such that the external surface of the inboard pane is the #6 surface.

The IG unit 110 can optionally include a laminated glass panel. In such cases, the laminated glass panel may be a switchable smart panel or a conventional non-switchable laminated glass panel (i.e., laminated glass that is not switchable between different optical states).

The IG unit 110 can optionally be mounted in a frame (e.g., a window frame, which may be a sash) such that the external surface 12 of the exterior pane 10 is exposed to an outdoor environment 77 while the external surface 18 of the interior pane 10' is exposed to a room-side interior environment. Each internal surface of the IG unit 110 is exposed to a between-pane space 800 of the IG unit. When the IG unit is a triple-pane IG unit, it will have two between-pane spaces. In some cases, the IG unit 110 is a vacuum IG unit.

Figure 5:
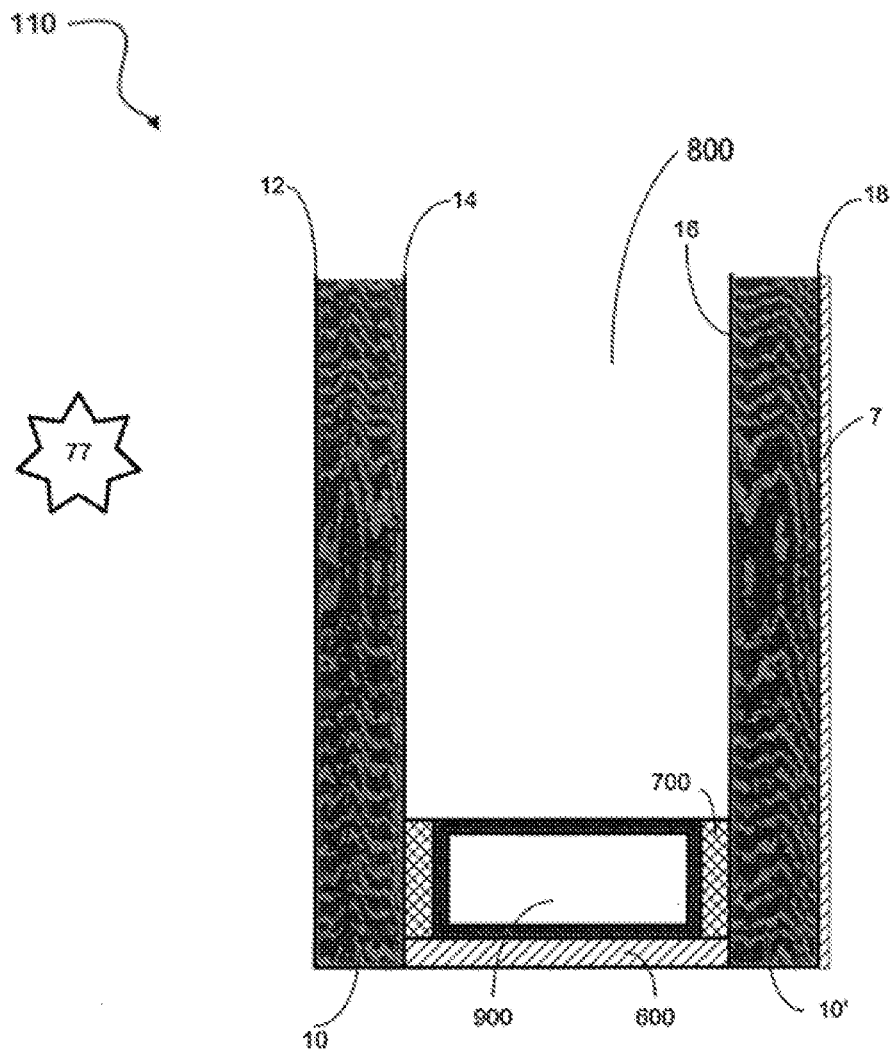
FIG. 5 is a partially broken-away schematic cross-sectional side view of a multiple-pane insulating glazing unit that includes an exterior pane and an interior pane, the interior pane having a fourth surface carrying a flash-treated transparent electrically conductive coating in accordance with certain embodiments of the invention.

The IG unit 110 includes at least one flash-treated transparent electrically conductive coating of the nature described above. In the embodiment of FIG. 5, for example, the external surface 18 of pane 10' has the flash-treated transparent electrically conductive coating 7. Here, the illustrated coating 7 is exposed to an environment (in some cases, a temperature-controlled living space) inside a residential building or another building.

Figure 8:
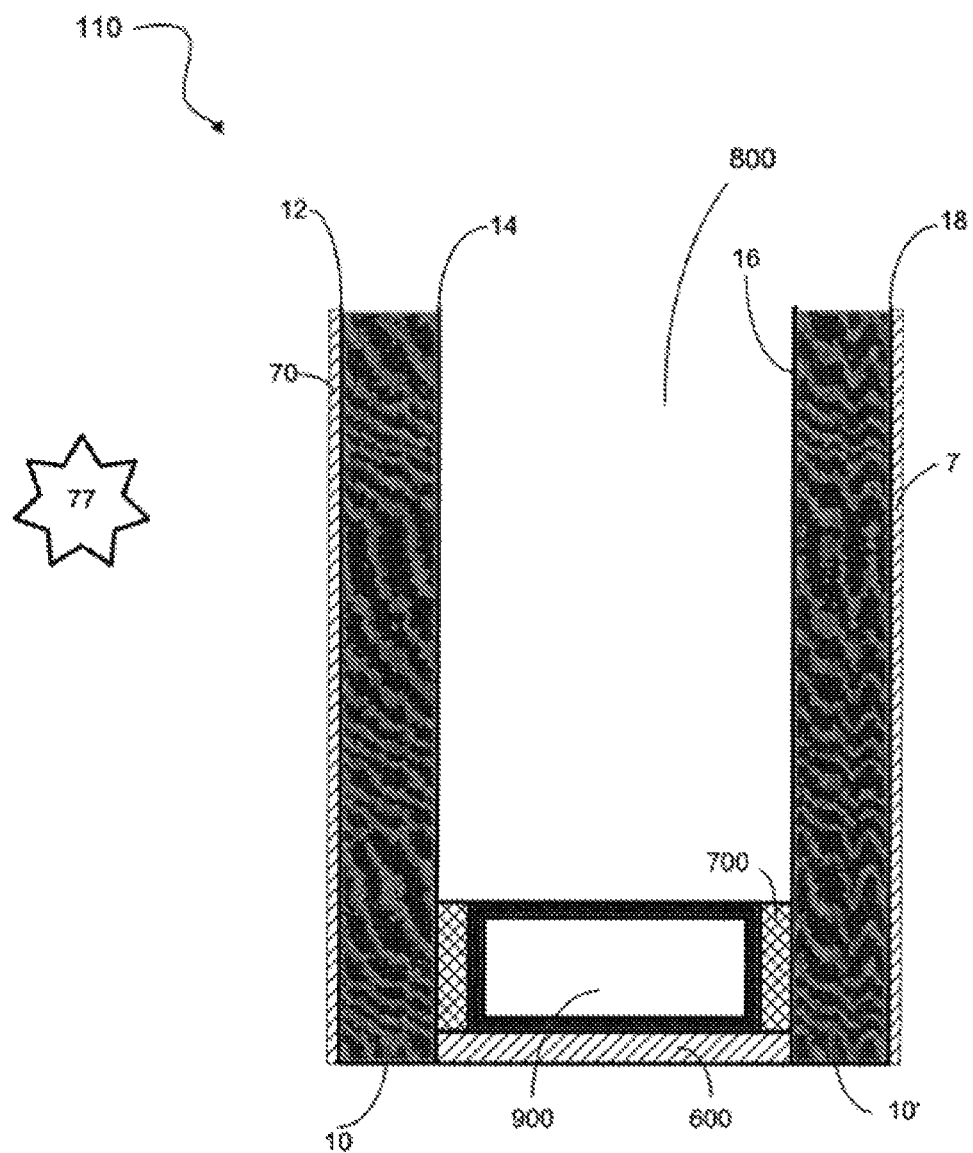
FIG. 8 is a partially broken-away schematic cross-sectional side view of a multiple-pane insulating glazing unit that includes an exterior pane and an interior pane, the exterior pane having a first surface carrying a hydrophilic and/or photocatalytic film, and the interior pane having a fourth surface carrying a transparent electrically conductive coating, in accordance with yet other embodiments of the invention.

The IG unit 110 can optionally bear one or more films comprising titanium oxide 70, such as a hydrophilic and/or photocatalytic film. In the embodiment of FIG. 8, for example, a film comprising titanium oxide 70 is provided on the external surface 12 of pane 10, so as to be exposed to an outdoor environment 77 (and thus in periodic contact with rain). The film comprising titanium oxide 70 can be part of a photocatalytic and/or hydrophilic coating. If desired, the IG unit 110 can bear two films comprising titanium oxide, e.g., one such film on the external surface 12 of pane 10 and another such film over a flash-treated transparent electrically conductive coating 7 on the external surface 18 of pane 10' (or one such film on the external surface 18 of pane 10' and another such film over a flash-treated transparent electrically conductive coating on the external surface 12 of pane 10).

Thus, in some cases, there are two films comprising titanium oxide on the IG unit. When provided, these two films may be different. For example, the external surface of the outboard pane and the external surface of the inboard pane can both have photocatalytic films, but they can be different (e.g., in terms of thickness or composition). If desired, a photocatalytic film on the external surface of the inboard pane can be responsive to activation by indoor light, while a photocatalytic film on the external surface of the outboard pane requires direct sunlight for activation. More generally, the indoor photocatalytic film may have a higher level of photoactivity (e.g., it may be thicker, doped to shift absorption into the visible, and/or it may have a more highly photoactive composition) than the outdoor photocatalytic film. When provided, the films comprising titanium oxide may, of course, be applied over one or more other films. For example, a first titanium oxide containing film can be provided over a flash-treated transparent electrically conductive coating on the external surface 12 of pane 10 while a second titanium oxide containing film is provided over a flash-treated transparent electrically conductive coating on the external surface 18 of pane 10'.

Figure 9:
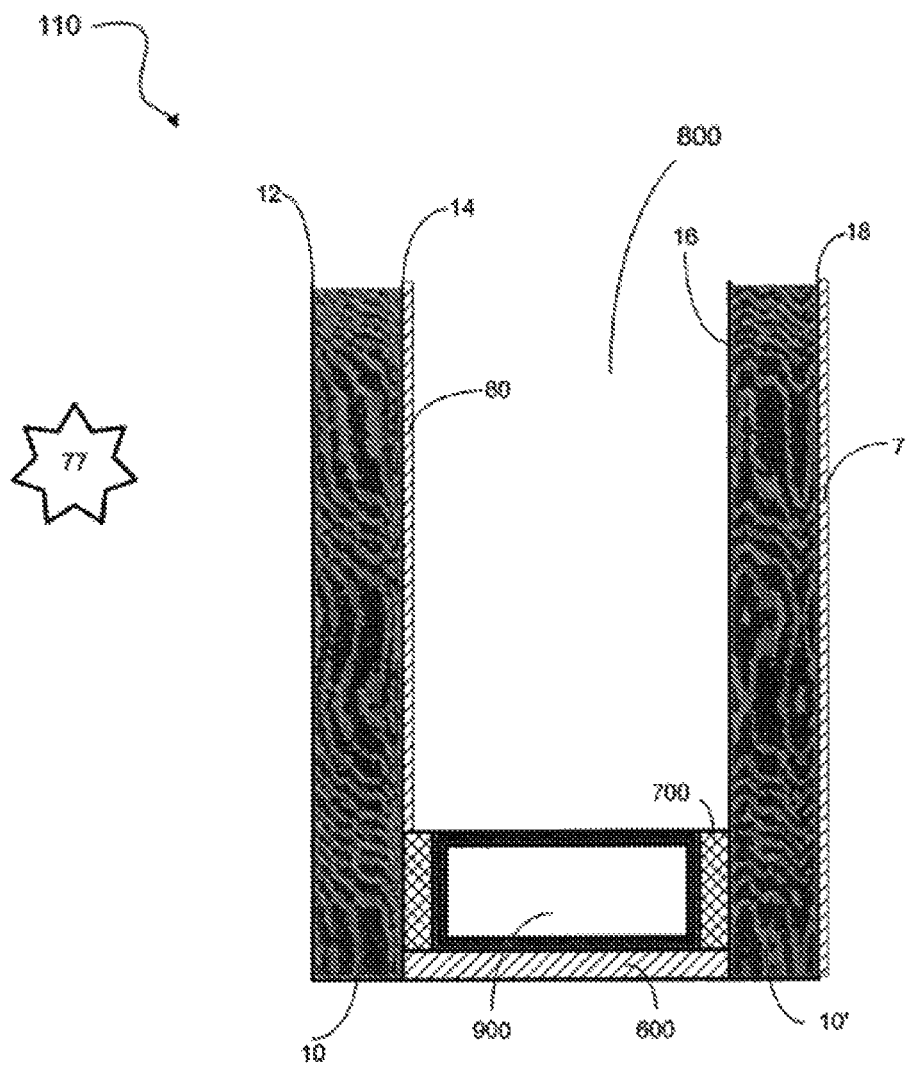
FIG. 9 is a partially broken-away schematic cross-sectional side view of a multiple-pane insulating glazing unit that includes an exterior pane and an interior pane, the exterior pane having a second surface carrying a low-emissivity coating, and the interior pane having a fourth surface carrying a flash-treated transparent electrically conductive coating, in accordance with further embodiments of the invention.
Figure 10:
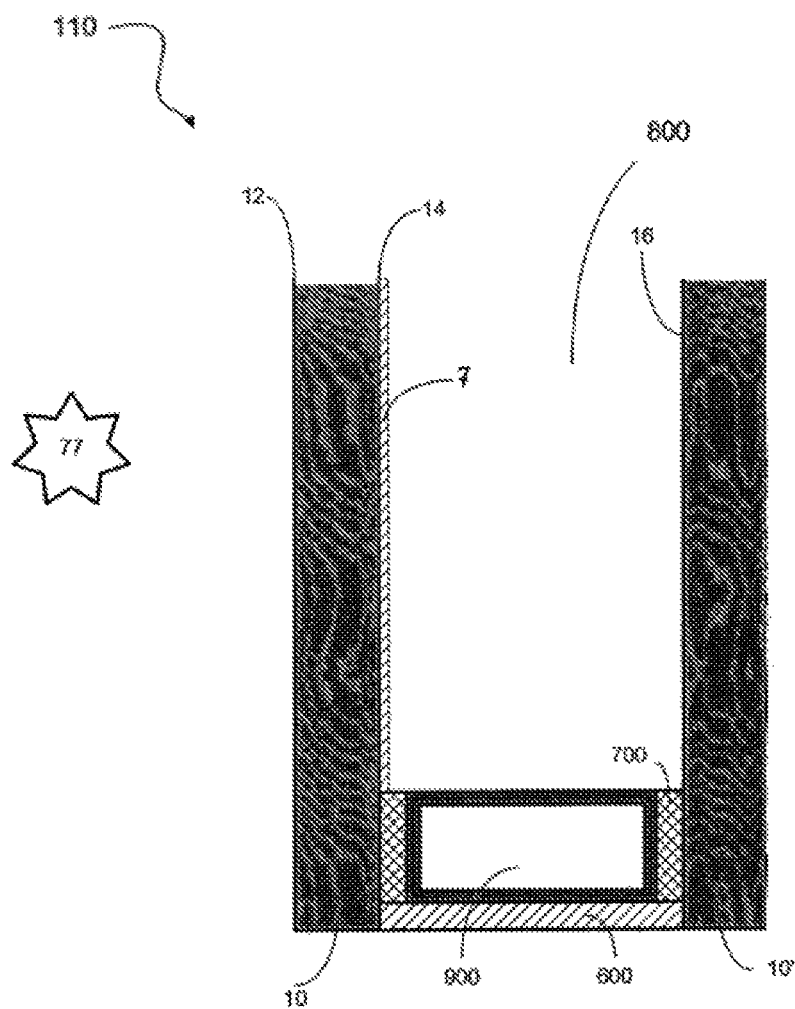
FIG. 10 is a partially broken-away schematic cross-sectional side view of a multiple-pane insulating glazing unit that includes an exterior pane and an interior pane, the exterior pane having a second surface carrying a flash-treated transparent electrically conductive coating, in accordance with still other embodiments of the invention.

The IG unit 110 can optionally include one or more low-emissivity coatings 80. In the embodiment of FIG. 9, the IG unit 110 includes a low-emissivity coating 80 on the internal surface 14 of pane 10. When provided, the low-emissivity coating 80 preferably includes at least one silver-inclusive film, which may contain more than 50% silver by weight (e.g., a metallic silver film). If desired, a low-emissivity coating can alternatively be on the internal surface 16 of pane 10'. In some embodiments, the low-emissivity coating includes three or more infrared-reflective films (e.g., silver-containing films). Low-emissivity coatings with three or more infrared-reflective films are described in U.S. patent application Ser. No. 11/546,152 and U.S. Pat. Nos. 7,572,511 and 7,572,510 and 7,572,509 and Ser. No. 11/545,211 and U.S. Pat. Nos. 7,342,716 and 7,339,728, the salient teachings of each of which are incorporated herein by reference. In other cases, the low-emissivity coating can be a "single silver" or "double silver" low-emissivity coating, which are well known to skilled artisans.

Figure 6:
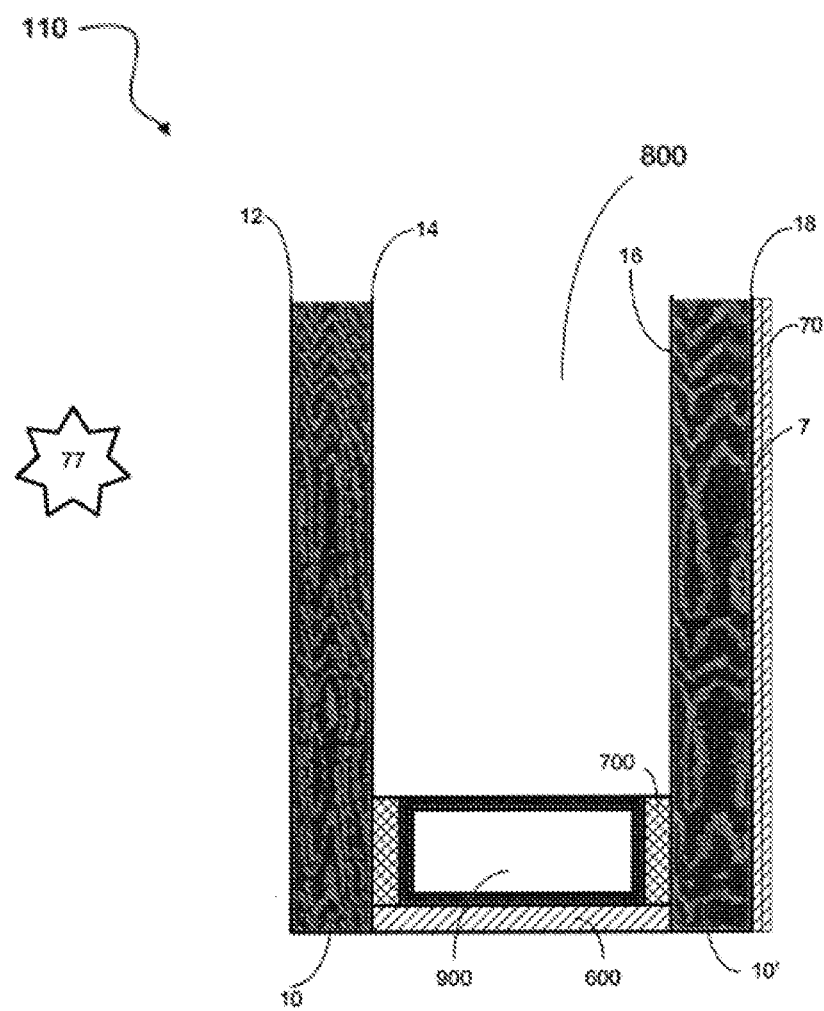
FIG. 6 is a partially broken-away schematic cross-sectional side view of a multiple-pane insulating glazing unit that includes an exterior pane and an interior pane, the interior pane having a fourth surface carrying a flash-treated transparent electrically conductive coating and a hydrophilic and/or photocatalytic film in accordance with other embodiments of the invention.
Figure 7:
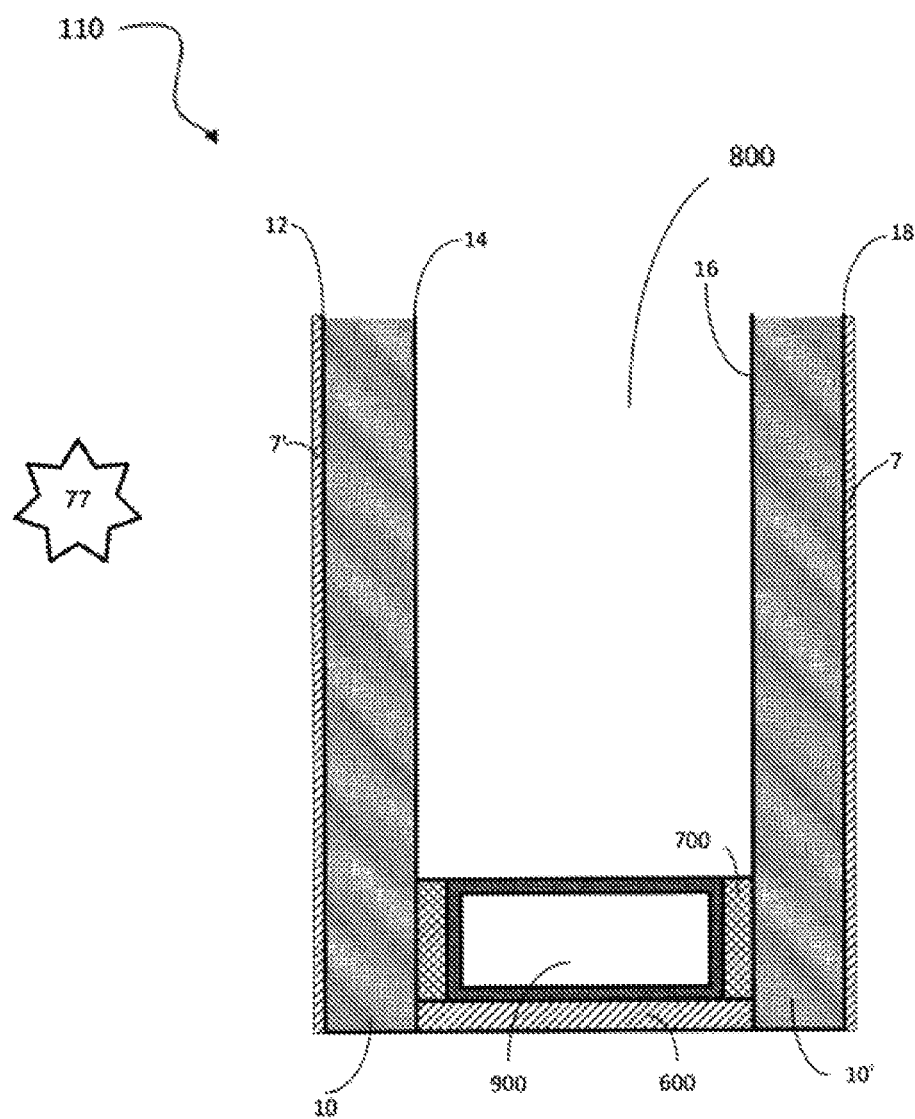
FIG. 7 is a partially broken-away schematic cross-sectional side view of a multiple-pane insulating glazing unit that includes an exterior pane and an interior pane, the exterior pane having a first surface carrying a flash-treated transparent electrically conductive coating, and the interior pane having a fourth surface carrying another flash-treated transparent electrically conductive coating, in accordance with still other embodiments of the invention.

If desired, the embodiment of FIG. 6 can have a low-emissivity coating on surface 14, on surface 16, or both. The same is true of the embodiments of FIGS. 7 and 8. Similarly, the embodiment of FIG. 9 can optionally have a low-emissivity coating on surface 16, in addition to (or instead of) having the illustrated low-emissivity coating 80 on surface 14. As another example, the embodiment of FIG. 10 can optionally have a low-emissivity coating on surface 16, in addition to having the illustrated flash-treated transparent electrically conductive coating 7 on surface 14. In another embodiment, the flash-treated transparent electrically conductive coating is provided on surface 16, optionally in combination with providing a low-emissivity coating on surface 14.

While the embodiment of FIG. 5 shows the flash-treated transparent electrically conductive coating 7 being on the #4 surface, any other surface (12, 14, or 16) of the IG unit 110 can alternatively be provided with a flash-treated transparent electrically conductive coating. In some embodiments, both external surfaces of an IG unit have flash-treated transparent electrically conductive coatings. For example, the IG unit 110 of FIG. 7 has a first flash-treated transparent electrically conductive coating 7 on the #4 surface, while a second flash-treated transparent electrically conductive coating 7' is on the #1 surface. For triple glazed IG units, a first flash-treated transparent electrically conductive coating can be provided on the #6 surface of the IG unit, while a second flash-treated transparent electrically conductive coating is provided on the #1 surface of the IG unit. Or, there can simply be a single flash-treated transparent electrically conductive coating on the #1 surface, the #2 surface, the #3 surface, the #4 surface, the #5 surface, or the #6 surface.

Thus, it can be appreciated that the flash-treated transparent electrically conductive coating can be provided on any one or more surfaces of an IG unit. When applied on the #1 surface, the outboard pane will stay warmer and have less condensation. When applied on an internal surface (such as a #2 surface, a #3 surface, or a #5 surface) of the IG unit, the coating 7 can provide an advantageous passive solar control solution. When applied on an external #4 or #6 surface, the inboard pane will stay cooler and save energy, but it may catch condensation. In such cases, a hydrophilic and/or photocatalytic coating may be provided over the flash-treated transparent electrically conductive coating so as to encourage rapid evaporation of any condensation that may occur. The flash-treated transparent electrically conductive coating may also be beneficial for a monolithic glazing, a laminated glass glazing, etc.

The flash-treated transparent electrically conductive coating has a number of beneficial properties. The ensuing discussion reports several of these properties. In some cases, properties are reported herein for a single (e.g., monolithic) pane 10' bearing the flash-treated transparent electrically conductive coating on one surface 18 ("the present pane"). In other cases, these properties are reported for a double-pane IG unit 110 having the flash-treated transparent electrically conductive coating on the #4 surface 18 and a triple-silver low-emissivity coating on the #2 surface. The triple-silver low-emissivity coating is known commercially as the LoE³-366 product from Cardinal CG Company. In such cases, the reported properties are for a double-pane IG unit wherein both panes are clear 2.2 mm annealed soda lime float glass with a ½ inch between-pane space filled with an insulative gas mix of 90% argon and 10% air ("the present IG unit"). Of course, these specifics are by no means limiting to the invention. For example, the flash-treated transparent electrically conductive coating can alternatively be provided on the #1 surface of the IG unit, the low-emissivity coating can alternatively be on the #3 surface, the low-emissivity coating can alternatively be a single or double silver low-emissivity coating, etc. Absent an express statement to the contrary, the present discussion reports determinations made using the well-known WINDOW 7.1 computer program (e.g., calculating center of glass data) under NFRC100-2010 conditions.

The flash-treated coating 7 provides low emissivity. The emissivity of the coating 7 is less than 0.35, such as from 0.05 to 0.28. In some embodiments, the emissivity is less than 0.22, less than 0.2, or even less than 0.18, such as about 0.15. In contrast, an uncoated pane of clear glass would typically have an emissivity of about 0.84.

The term "emissivity" is well known in the present art. This term is used herein in accordance with its well-known meaning to refer to the ratio of radiation emitted by a surface to the radiation emitted by a blackbody at the same temperature. Emissivity is a characteristic of both absorption and reflectance. It is usually represented by the formula: E=1−Reflectance. The present emissivity values can be determined as specified in "Standard Test Method for Emittance of Specular Surfaces Using Spectrometric Measurements," NFRC 301-2010, the entire teachings of which are incorporated herein by reference.

In addition to low emissivity, the U Value of the present IG unit 110 is very low. As is well known, the U Value of an IG unit is a measure of the thermal insulating property of the unit. The smaller the U value, the better the insulating property of the unit. The U Value of the present IG unit is less than 0.3 (i.e., center of glass U value), preferably less than 0.25, and perhaps optimally 0.24 or less, such as from 0.20-0.23.

The term U Value is well known in the present art. It is used herein in accordance with its well-known meaning to express the amount of heat that passes through one unit of area in one unit of time for each unit of temperature difference between a hot side of the IG unit and a cold side of the IG unit. The U Value can be determined in accordance with the standard specified for $U_{winter}$ in NFRC 100-2014, the teachings of which are incorporated herein by reference.

A tradeoff is sometimes made in low U value coatings whereby the film(s) selected to achieve a low U value have the effect of decreasing the visible transmittance to a lower level than is desired and/or increasing the visible reflectance to a higher level than is ideal. As a consequence, windows bearing these coatings may have unacceptably low visible transmission, a somewhat mirror-like appearance, or suboptimal color properties.

In combination with the beneficial properties discussed above, the flash-treated coating 7 has good optical properties. As noted above, a tradeoff is sometimes made in low U value coatings whereby the films selected to achieve a low U value have the effect of restricting the visible transmission to a level that is lower than ideal.

To the contrary, the present coating 7 provides an exceptional combination of these properties. For example, the present IG unit 110 (and the present pane 10', whether monolithic or as part of the IG unit 110) has a visible transmittance $T_v$ of greater than 0.5 (i.e., a visible transmission of greater than 50%). Preferably, the present IG unit 110 (and the present pane 10', whether monolithic or insulated) achieves a visible transmittance $T_v$ of greater than 0.60 (i.e., a visible transmission of greater than 60%), or greater than 0.62 (i.e., a visible transmission of greater than 62%), such as about 0.63.

Further, if the triple silver low-emissivity coating is replaced with a double silver low-emissivity coating like the LoE²-270™ or LoE²-272™ coatings from Cardinal CG Company, the present IG unit 110 (and the present pane 10', whether monolithic or insulated) can exhibit a visible transmittance $T_v$ of greater than 0.65 (i.e., a visible transmission of greater than 65%), or even greater than 0.68, such as about 0.69-0.70.

Moreover, if the triple silver low-emissivity coating is replaced with a single silver low-emissivity coating like the LoE-180™ coating from Cardinal CG Company, the present IG unit 110 (and the present pane 10', whether monolithic or insulated) can exhibit a visible transmittance $T_v$ of greater than 0.70 (i.e., a visible transmission of greater than 70%), or even greater than 0.75, such as about 0.77.

While the desired level of visible transmission can be selected and varied to accommodate different applications, preferred embodiments provide a coated pane 10' having a post-flash-treatment monolithic visible transmission of greater than 82%, greater than 85%, or even greater than 86%, such as greater than 86% but less than 92%.

The term "visible transmission" is well known in the art and is used herein in accordance with its well-known meaning to refer to the percentage of all incident visible radiation that is transmitted through the IG unit 110. Visible radiation constitutes the wavelength range of between about 380 nm and about 780 nm. Visible transmittance, as well as visible reflectance, can be determined in accordance with NFRC 300-2014, Standard Test Method for Determining the Solar and Infrared Optical Properties of Glazing Materials and Fading Resistance of Systems. The well-known WINDOW 7.1 computer program can be used in calculating these and other reported optical properties.

The flash-treated electrically conductive coating 7 can provide desirable reflected color properties in combination with excellent thermal insulating properties. For example, the present IG unit 110 can optionally exhibit an exterior reflected color characterized by an "a" color coordinate of between −7 and 2 (e.g., between −5 and 1, such as about −1.9) and a "b" color coordinate of between −9 and 0 (e.g., between −6 and −1, such as about −3.4).

The present discussion of color properties is reported using the well-known color coordinates of "a" and "b." In more detail, the reported color coordinates result from conventional use of the well-known Hunter Lab Color System (Hunter methods/units, Ill. D65, 10 degree observer). The present color properties can be determined as specified in ASTM Method E 308, the relevant teachings of which are incorporated herein by reference.

In certain embodiments, the foregoing color properties are provided in combination with the sheet resistance, emissivity, U value, and visible transmission properties reported above. For example, the following chart depicts preferred combinations of properties in accordance with certain embodiments (the tabulated properties are after flash treatment).

|  | preferred | more preferred |
|---|---|---|
| Sheet resistance | less than 15 Ω/square | less than 13 Ω/square |
| emissivity | less than 0.25 | less than 0.18 |
| U value | less than 0.3 | less than 0.25 |
| $T_{v\ monolithic}$ | greater than 82% | greater than 86% |

In one embodiment, a multiple-pane insulating glazing unit includes an internal pane surface bearing a low-emissivity coating that has only one film comprising silver. The multiple-pane insulating glazing unit includes two glass panes and a between-pane space. The two glass panes respectively define two opposed external pane surfaces. The low-emissivity coating is exposed to the between-pane space of the IG unit. The film comprising silver preferably contains at least 50% silver by weight. A desired one of the two external pane surfaces has a flash-treated transparent conductive oxide coating, such that a desired one of the two glass panes is a coated glass pane. This coated glass pane is annealed glass having a surface stress of less than 3,500 psi. The transparent conductive oxide coating comprises a flash-treated indium tin oxide film and an overcoat film. The flash-treated indium tin oxide film has a thickness of less than 1,800 Å and is a sputtered film having a surface roughness of less than 3 nm. In the present embodiments, the flash-treated indium tin oxide film has a sheet resistance of less than 15 ohms/square in combination with the coated pane having a monolithic visible transmittance of greater than 0.82. The flash-treated indium tin oxide film has an optical bandgap of 370 nm or shorter and is characterized by a pre-flash optical bandgap of 400 nm or longer. In the present embodiments, the IG unit has a U value of less than 0.25 together with an IGU visible transmission of greater than 75%. In this embodiment, the IG unit preferably exhibits an exterior reflected color characterized by an "a" color coordinate of between −6 and 0 and a "b" color coordinate of between −8 and −1.

In another embodiment, a multiple-pane insulating glazing unit includes an internal pane surface bearing a low-emissivity coating that has only two films comprising silver. The multiple-pane insulating glazing unit includes two glass panes and a between-pane space. The two glass panes respectively define two opposed external pane surfaces. Preferably, each film comprising silver contains at least 50% silver by weight. The low-emissivity coating is exposed to the between-pane space of the IG unit. The two glass panes respectively define two opposed external pane surfaces. A desired one of the two external pane surfaces has a flash-treated transparent conductive oxide coating, such that a desired one of the two glass panes is a coated glass pane. This coated glass pane is annealed glass having a surface stress of less than 3,500 psi. The transparent conductive oxide coating comprises a flash-treated indium tin oxide film and an overcoat film. The flash-treated indium tin oxide film has a thickness of less than 1,800 Å and is a sputtered film having a surface roughness of less than 3 nm. In the present embodiments, the flash-treated indium tin oxide film has a sheet resistance of less than 15 Ω/square in combination with the desired pane having a monolithic visible transmittance of greater than 0.82. The flash-treated indium tin oxide film has an optical bandgap of 370 nm or shorter and is characterized by a pre-flash optical bandgap of 400 nm or longer. In the present embodiment, the multiple-pane insulating glazing unit has a U value of less than 0.25 together with an IGU visible transmission of greater than 65%. In this embodiment, the IG unit preferably exhibits an exterior reflected color characterized by an "a" color coordinate of between −6 and 0 and a "b" color coordinate of between −8 and −1.

In still another embodiment, a multiple-pane insulating glazing unit includes an internal pane surface bearing a low-emissivity coating that includes three films comprising silver. The multiple-pane insulating glazing unit includes two glass panes and a between-pane space. The two glass panes respectively define two opposed external pane surfaces. Preferably, each film comprising silver contains at least 50% silver by weight. The low-emissivity coating is exposed to the between-pane space of the IG unit. A desired one of the two external pane surfaces has a flash-treated transparent conductive oxide coating, such that a desired one of the two glass panes is a coated glass pane. This coated glass pane is annealed glass having a surface stress of less than 3,500 psi. The transparent conductive oxide coating comprises a flash-treated indium tin oxide film and an overcoat film. The flash-treated indium tin oxide film has a thickness of less than 1,800 Å and is a sputtered film having a surface roughness of less than 3 nm. In the present embodiments, the flash-treated indium tin oxide film has a sheet resistance of less than 15 Ω/square in combination with the coated pane having a monolithic visible transmittance of greater than 0.82. The flash-treated indium tin oxide film has an optical bandgap of 370 nm or shorter and is characterized by a pre-flash optical bandgap of 400 nm or longer. In the present embodiment, the multiple-pane insulating glazing unit has a U value of less than 0.25 together with an IGU visible transmission of greater than 60%. In this embodiment, the IG unit preferably exhibits an exterior reflected color characterized by an "a" color coordinate of between −6 and 1 and a "b" color coordinate of between −7 and −1.

In the foregoing three embodiments, the IG unit can be, for example, a double-pane unit with coating 7 on the #4 surface and the low-emissivity coating on the #2 surface. The flash-treated coating 7 can consist of the following layers: silicon dioxide at about 100 Å/ITO (90% In/10% Sn) at about 1,200-1,400 Å/tin oxide at about 150 Å/SiON at about 900 Å. The low-emissivity coating in the first of the foregoing three embodiments can, for example, be a single-silver low-emissivity coating like the commercially available LoE-180™ coating from Cardinal CG Company of Eden Prairie, Minn., USA. The low-emissivity coating in the second of the foregoing three embodiments can, for example, be a double-silver low-emissivity coating like the commercially available LoE²-270™ or LoE²-272™ coatings from Cardinal CG Company. The low-emissivity coating in the third of the foregoing three embodiments can, for example, be a triple-silver low-emissivity coating like the commercially available LoE³-366™ coating from Cardinal CG Company. These single, double, and triple-silver low-emissivity coatings can optionally be used in any embodiment of the present disclosure where a single, double, or triple-silver low-emissivity coating is provided.

The invention provides one group of embodiments wherein the coating 7 has an intermediate level of electrical conductivity. In these embodiments, the post-flash-treatment sheet resistance and emissivity are higher than the preferred and more preferred ranges tabulated above. Specifically, the emissivity is in the range of from 0.25 to 0.55. The monolithic visible transmission of the flash-treated coated glass pane in these embodiments is greater than 75%, preferably greater than 80%, and more preferably greater than 85%, such as greater than 86% but less than 92%. The post-flash-treatment visible absorption of the coating 7 preferably is less than 5%, such as greater than 0.5% but less than 4.5%. In the present embodiments, the indium tin oxide film 20 preferably has a thickness of less than 1,500 Å, such as between 100 Å and 1,475 Å. In some of the present embodiments, the thickness of the indium tin oxide film 20 is greater than 100 Å but less than 1,100 Å, less than 750 Å, less than 500 Å, or even less than 300 Å. One exemplary coating 7 has a layer of ITO on a glass substrate, where the ITO layer has a thickness of about 1,060 Å. In this case, the emissivity is about 0.45. In another example, the coating 7 has the following layer stack: glass/ITO at about 170 Å/SnO$_2$ at about 1,135 Å/SiON at about 560 Å. In this example, the post-flash-treatment emissivity is about 0.5. In still another example, the coating 7 has the following layer stack: glass/ITO at about 520 Å/SnO$_2$ at about 785 Å/SiON at about 560 Å. In this example, the post-flash-treatment emissivity is about 0.31. If desired, a base coat 15 of the nature described previously may be added to any of these film stacks. Additionally or alternatively, an uppermost layer comprising titanium oxide can optionally be added.

While some preferred embodiments of the invention have been described, it should be understood that various changes, adaptations and modifications may be made therein without departing from the spirit of the invention and the scope of the appended claims.

What is claimed is:

1. A method of producing coated glass, the method comprising providing a glass pane having opposed first and second surfaces, the method further comprising sputtering a metallic indium tin target in an oxidizing atmosphere so as to deposit a substoichiometric indium tin oxide film on the first surface of the glass pane, thereby producing a coated glass pane, the substoichiometric indium tin oxide film having a thickness of less than 1,800 Å, a surface roughness of less than 3 nm, an optical bandgap of 400 nm or longer, and a carrier concentration of $5\times10^{20}/cm^3$ or less, the method further comprising flash treating the substoichiometric indium tin oxide film so as to produce a flash-treated indium tin oxide film, said flash treating involves using one or more flash lamps to achieve ultra-high-power flash treatment at a peak pulse power of 20-45 kW/cm$^2$, the flash-treated indium tin oxide film having a thickness of less than 1,800 Å, a surface roughness of less than 3 nm, an optical bandgap of 370 nm or shorter, a carrier concentration of $9\times10^{20}/cm^3$ or more, and a sheet resistance of less than 15 Ω/square in combination with providing said coated glass pane with a monolithic visible transmittance of greater than 0.82.

2. The method of claim 1 wherein said flash treatment produces a carrier concentration factor of at least 5.

3. The method of claim 1 wherein the carrier concentration of the flash-treated indium tin oxide film is $9\text{-}13\times10^{20}/cm^3$.

4. The method of claim 1 wherein the substoichiometric indium tin oxide film has a visible absorption of greater than 7%, and the flash-treated indium tin oxide film has a visible absorption of less than 5%.

5. The method of claim 1 wherein said flash treatment produces a ΔA of nine percent or more.

6. The method of claim 1 wherein the flash-treated indium tin oxide film has a thickness of less than 1,500 Å and yet its sheet resistance is less than 15 Ω/square.

7. The method of claim 6 wherein the thickness of the flash-treated indium tin oxide film is between 1,050 Å and 1,450 Å in combination with the monolithic visible transmittance of said coated glass pane being greater than 0.86 but less than 0.92 and the sheet resistance being greater than 10 Ω/square but less than 13 Ω/square.

8. The method of claim 1 wherein the flash-treated indium tin oxide film is non-porous.

9. The method of claim 1 further comprising sputter depositing an overcoat film on the substoichiometric indium tin oxide film, the overcoat film being sputter deposited to a thickness of between 100 Å and 1,300 Å.

10. The method of claim 1 wherein the overcoat film is formed of an oxide material and is deposited directly onto the flash-treated indium tin oxide film, and the flash-treated indium tin oxide film is deposited directly onto the first surface of the glass pane, the flash-treated indium tin oxide film having a sodium concentration of less than 100 ppm.

11. The method of claim 1 wherein the surface roughness of the flash-treated indium tin oxide film is between 1.5 nm and 3 nm.

12. The method of claim 1 wherein the second surface of the glass pane is maintained at a temperature of 150 degrees C. or less during said flash treatment.

13. A method of producing coated glass, the method comprising providing a glass pane having opposed first and second surfaces, the method further comprising sputtering a metallic indium tin target in an oxidizing atmosphere so as to deposit a substoichiometric indium tin oxide film on the first surface of the glass pane, thereby producing a coated glass pane, the substoichiometric indium tin oxide film having a thickness of greater than 100 Å but less than 1,500 Å, a surface roughness of greater than 1.5 nm but less than 3 nm, an optical bandgap of 400 nm or longer, and a carrier concentration of $5\times10^{20}/cm^3$ or less, the method further comprising flash treating the substoichiometric indium tin oxide film so as to produce a flash-treated indium tin oxide film, said flash treating involves using one or more flash lamps to achieve ultra-high-power flash treatment at a peak pulse power of 20-45 kW/cm$^2$, the flash-treated indium tin oxide film having a thickness of greater than 100 Å but less than 1,500 Å, a surface roughness of greater than 1.5 nm but less than 3 nm, an optical bandgap of 370 nm or shorter, a carrier concentration of $9\times10^{20}/cm^3$ or more, and a sheet resistance of less than 30 Ω/square in combination with providing said coated glass pane with a monolithic visible transmittance of greater than 0.85.

14. The method of claim 13 wherein said flash treatment produces a carrier concentration factor of at least 5.

15. The method of claim 13 wherein said flash treatment produces a ΔA of five percent or more.

16. The method of claim 13 wherein the thickness of the flash-treated indium tin oxide film is greater than 100 Å but less than 1,100 Å, and the flash-treated indium tin oxide film has an emissivity in the range of from 0.25 to 0.55.

17. The method of claim 13 wherein the substoichiometric indium tin oxide film has a visible absorption in the range of 7.5-12%, and the flash-treated indium tin oxide film has a visible absorption in the range of 0.5-4.5%.

18. The method of claim 13 wherein the sheet resistance of the flash-treated indium tin oxide film is less than 15 Ω/square in combination with the monolithic visible transmittance being greater than 0.86 but less than 0.92.

19. The method of claim 13 further comprising sputter depositing an overcoat film on the substoichiometric indium tin oxide film, the overcoat film being sputter deposited to a thickness of between 100 Å and 1,300 Å.

20. The method of claim 1 wherein said flash treating involves using a flash treatment device comprising the one or more flash lamps to emit a pulse packet of 5-15 pulses, with each pulse being between 50 and 200 microseconds and such that an off-time between pulses is in a range of 50-100 microseconds.

21. The method of claim 20 wherein the pulse packet has a total energy in a range of from 18 $J/cm^2$ to 24 $J/cm^2$.

22. The method of claim 1 wherein the flash-treated indium tin oxide has a sodium concentration of less than 10 ppm.

23. The method of claim 1 wherein said coated glass has a haze level of less than 0.2.

24. The method of claim 13 wherein said flash treating involves using a flash treatment device comprising the one or more flash lamps to emit a pulse packet of 5-15 pulses, with each pulse being between 50 and 200 microseconds and such that an off-time between pulses is in a range of 50-100 microseconds.

25. The method of claim 24 wherein the pulse packet has a total energy in a range of from 18 $J/cm^2$ to 24 $J/cm^2$.

26. The method of claim 13 wherein the flash-treated indium tin oxide film has a sodium concentration of less than 1 ppm.

27. The method of claim 13 wherein said coated glass has a haze level of less than 0.1.

28. The method of claim 13 wherein the second surface of the glass pane is maintained at a temperature of lower than 125 degrees C. during said flash treatment.

\* \* \* \* \*